(12) United States Patent
Muhammad et al.

(10) Patent No.: US 7,466,777 B2
(45) Date of Patent: Dec. 16, 2008

(54) ACTIVE REMOVAL OF ALIASING FREQUENCIES IN A DECIMATING STRUCTURE BY CHANGING A DECIMATION RATIO IN TIME AND SPACE

(75) Inventors: Khurram Muhammad, Richardson, TX (US); Robert B. Staszewski, Garland, TX (US); Gennady Feygin, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 726 days.

(21) Appl. No.: 10/924,159

(22) Filed: Aug. 23, 2004

(65) Prior Publication Data

US 2005/0025268 A1 Feb. 3, 2005

(51) Int. Cl.
 *H03D 1/04* (2006.01)
(52) U.S. Cl. .................................. 375/346; 375/350
(58) Field of Classification Search ................. 375/346, 375/327, 328, 373, 376, 372, 254, 285; 455/307, 455/339
See application file for complete search history.

(56) References Cited

U.S. PATENT DOCUMENTS

| | | | |
|---|---|---|---|
| 5,392,456 A * | 2/1995 | Mitomo et al. ......... 340/825.21 |
| 5,661,810 A | 8/1997 | Chahabadi et al. |
| 6,194,939 B1 * | 2/2001 | Omas .......................... 327/298 |
| 6,246,275 B1 * | 6/2001 | Wodnicki et al. ............ 327/291 |
| 6,265,864 B1 * | 7/2001 | De Winter et al. ........ 324/207.2 |
| 6,391,667 B1 * | 5/2002 | Hashimoto ..................... 438/17 |
| 6,480,553 B1 * | 11/2002 | Ho et al. ....................... 375/272 |
| 6,543,279 B1 * | 4/2003 | Yones et al. ................. 73/146.5 |
| 6,631,157 B1 * | 10/2003 | Davidovici et al. ......... 375/148 |
| 2001/0036811 A1 * | 11/2001 | Kianush et al. ................ 455/41 |
| 2002/0081988 A1 | 6/2002 | Parker |
| 2003/0069911 A1 | 4/2003 | Pllrainen |
| 2006/0153284 A1 * | 7/2006 | Souissi et al. ................ 375/219 |

* cited by examiner

*Primary Examiner*—Emmanuel Bayard
(74) *Attorney, Agent, or Firm*—Ronald O. Neerings; Wade James Brady, III; Frederick J. Telecky, Jr.

(57) ABSTRACT

When a sample stream is decimated, frequency components from outside of a desired frequency band are aliased into the desired band, causing interference and loss of information. Different decimating ratios result in different frequencies aliasing into the desired frequency band. A current-mode sampling mixer 800 with capacitor banks 811 and 812 that are controlled by a digital control unit 820 with a capability to integrate and decimate an RF current at different decimating ratios is able to measure the frequency spectrum with different decimating ratios. The measured frequency spectrum is then analyzed to detect the presence of interferers aliased into the desired frequency band. The interferers can then be eliminated or avoided.

20 Claims, 10 Drawing Sheets

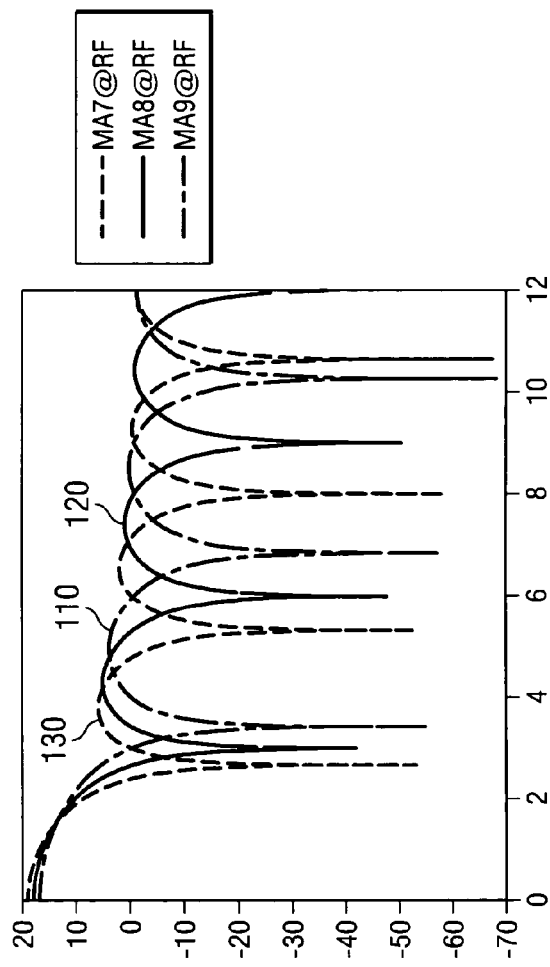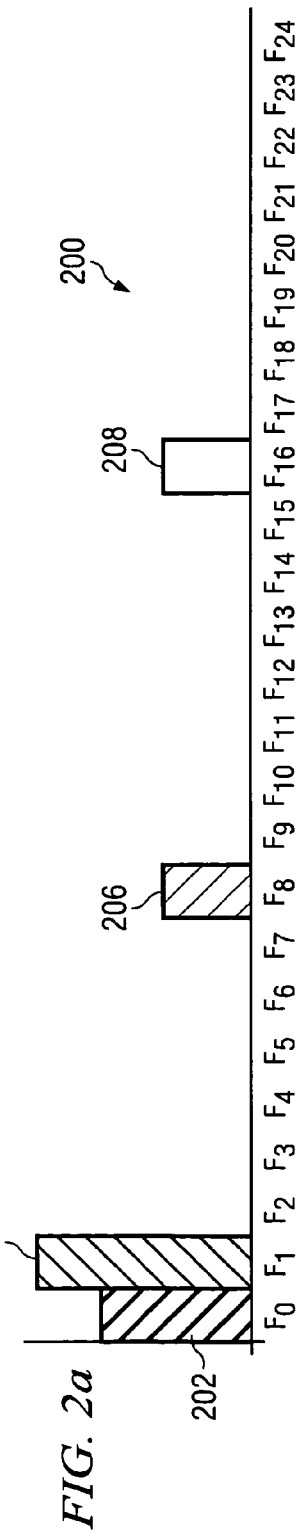
FIG. 1
FIG. 2a

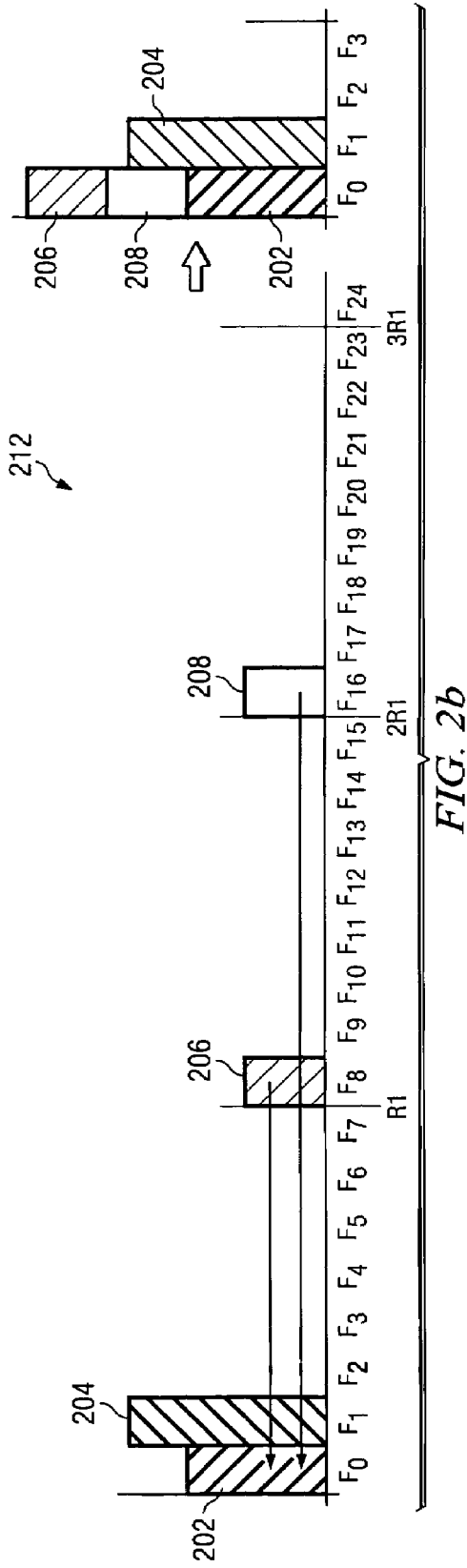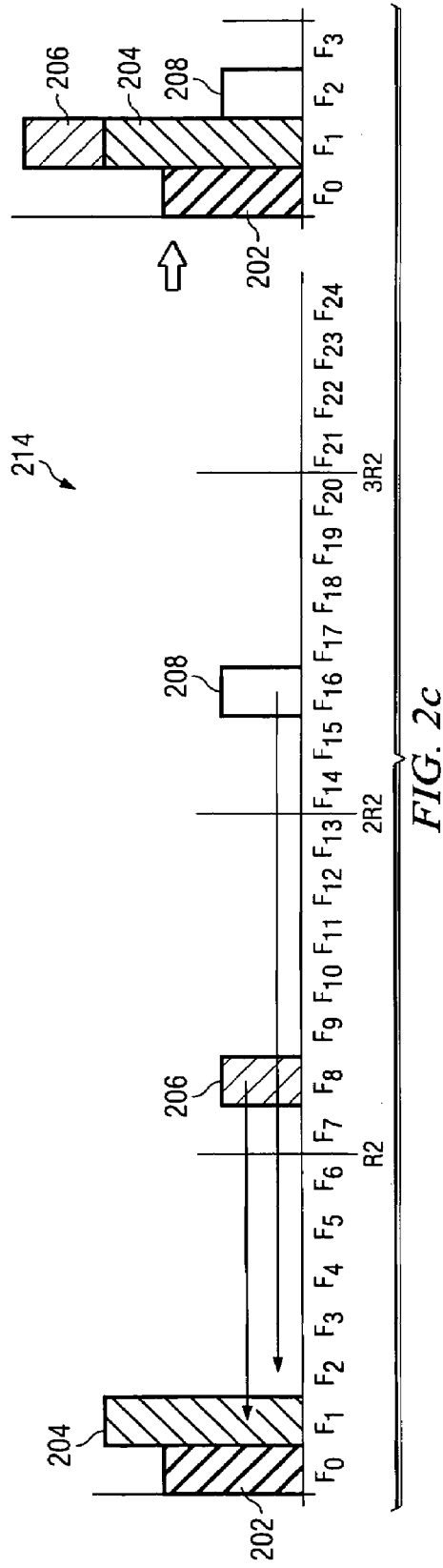
FIG. 2b
FIG. 2c

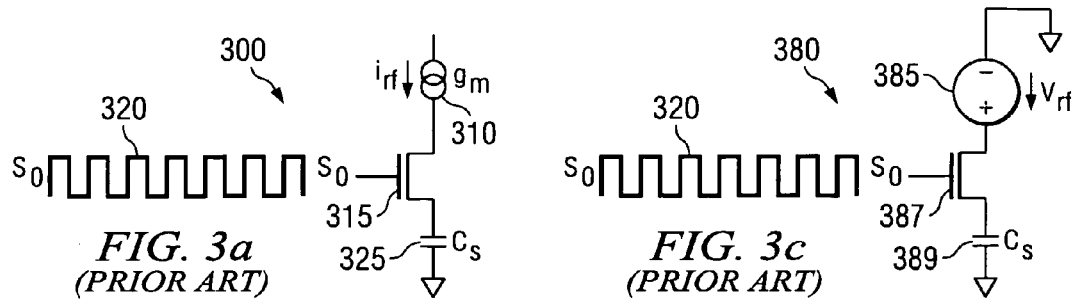
FIG. 3a (PRIOR ART)
FIG. 3c (PRIOR ART)
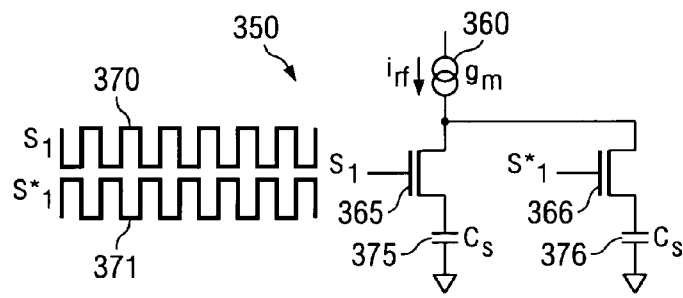
FIG. 3b (PRIOR ART)
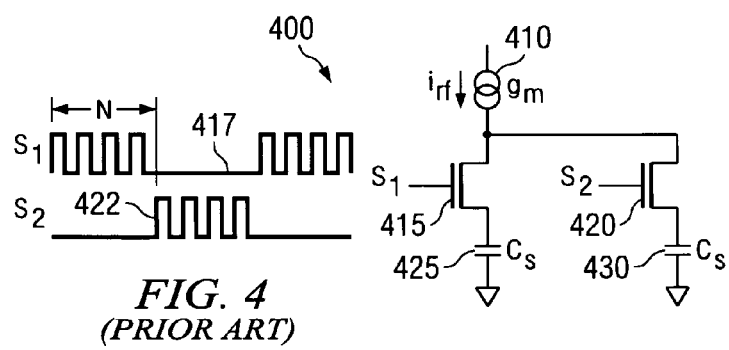
FIG. 4 (PRIOR ART)
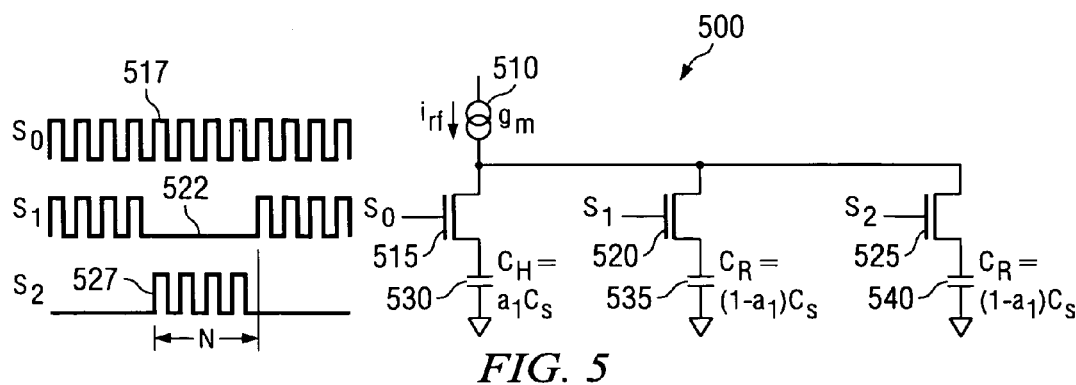
FIG. 5

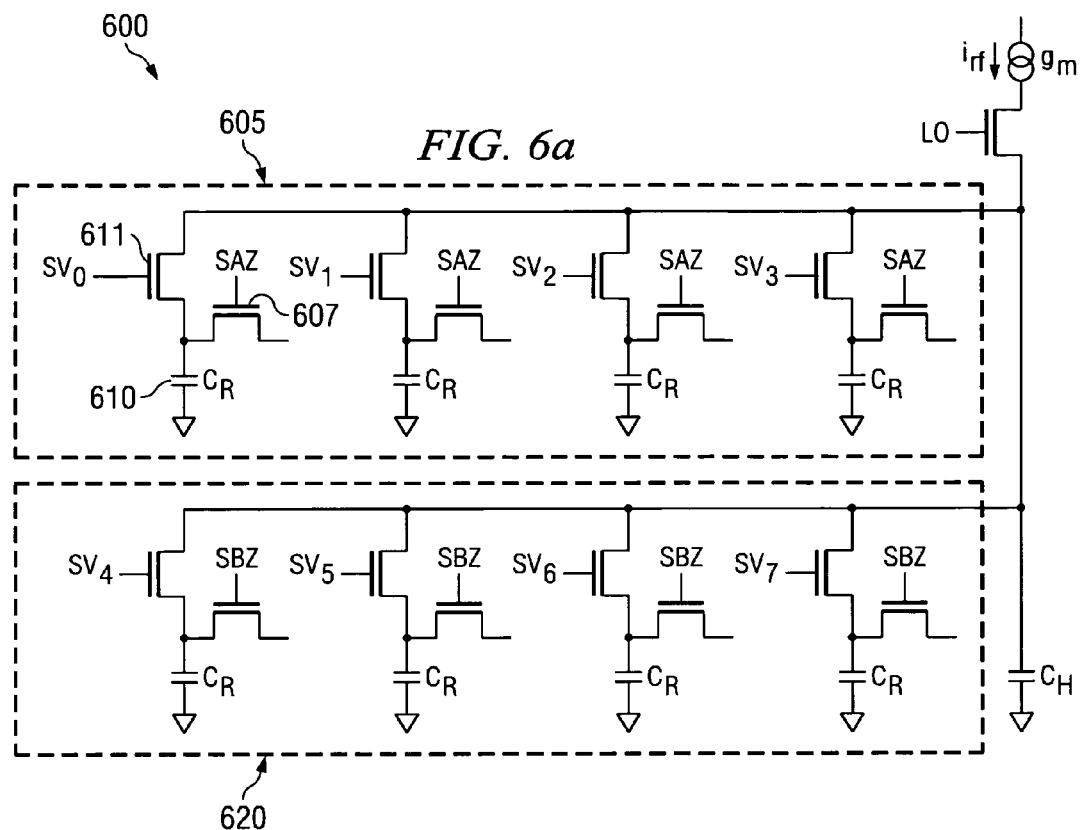
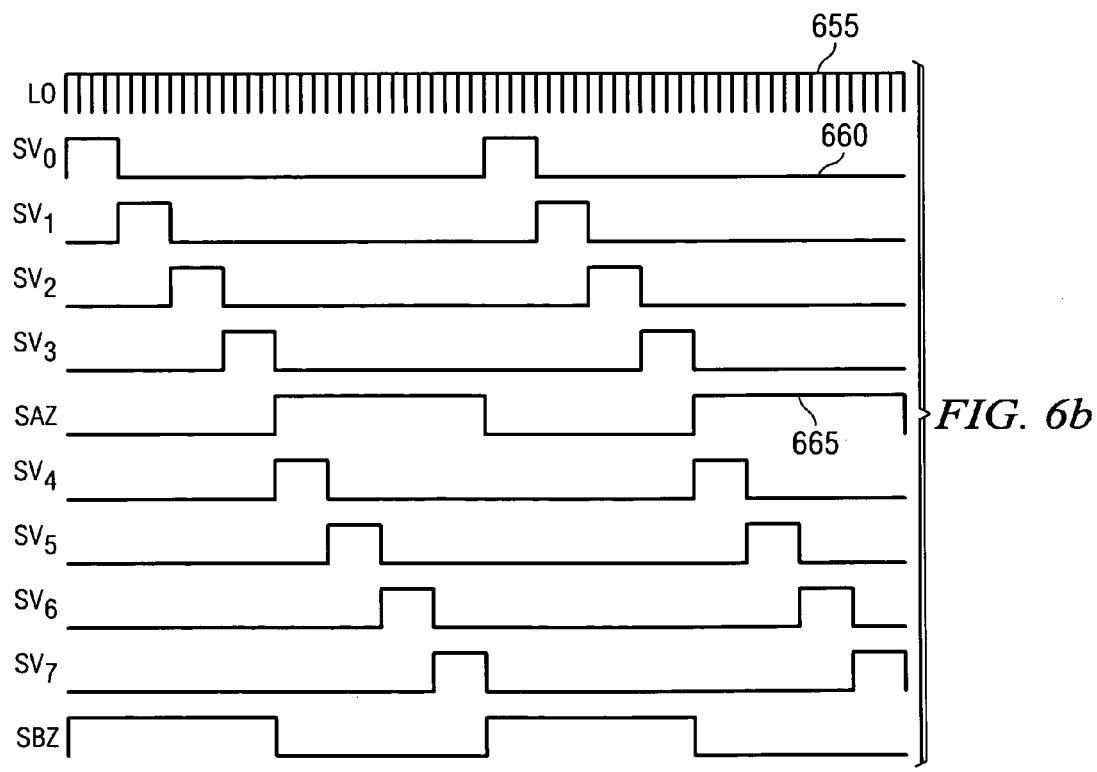

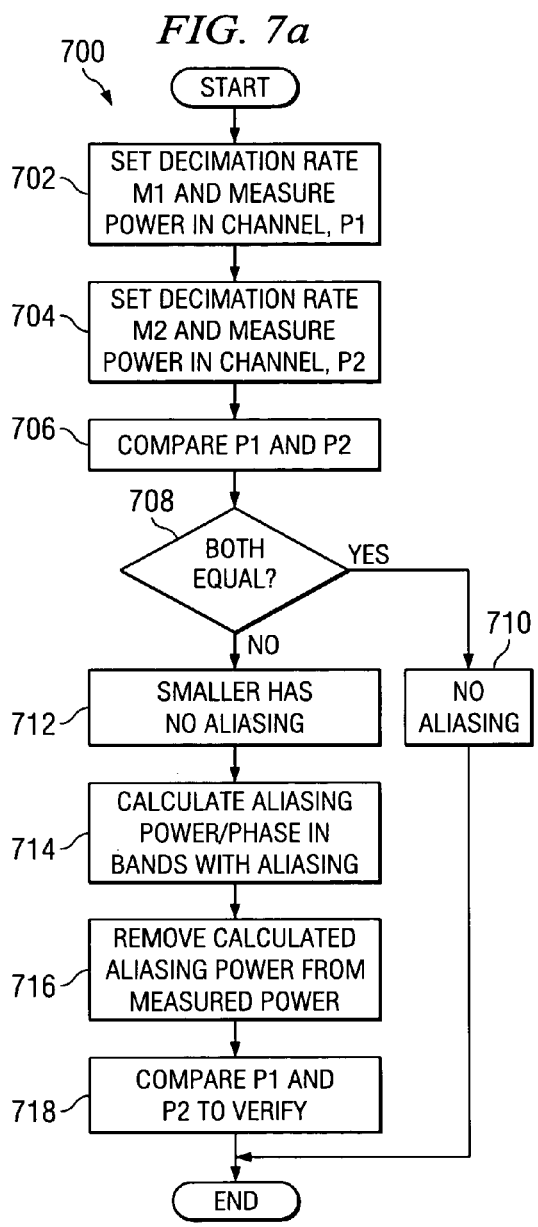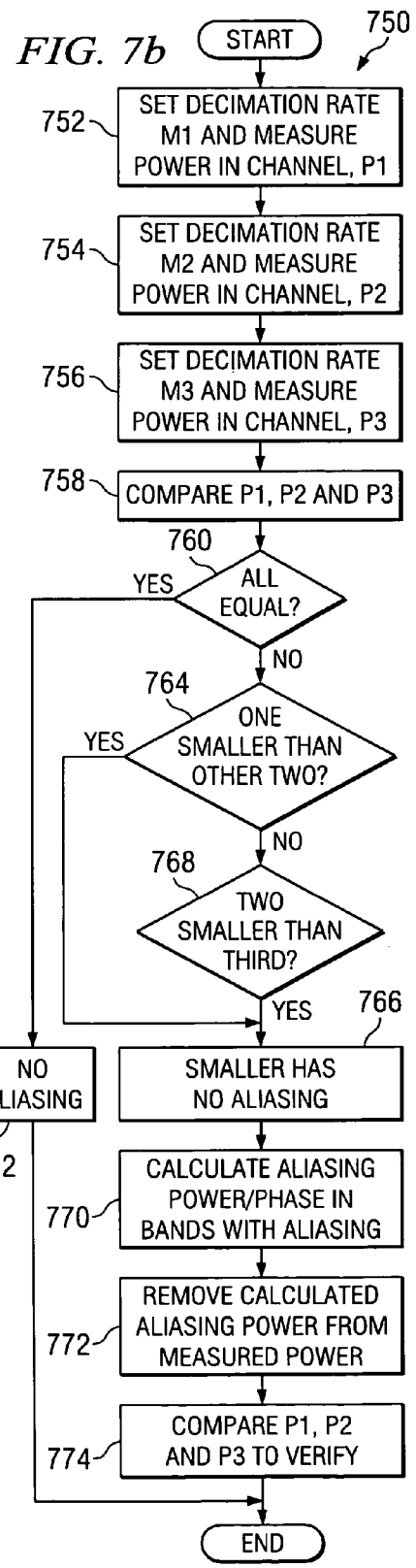

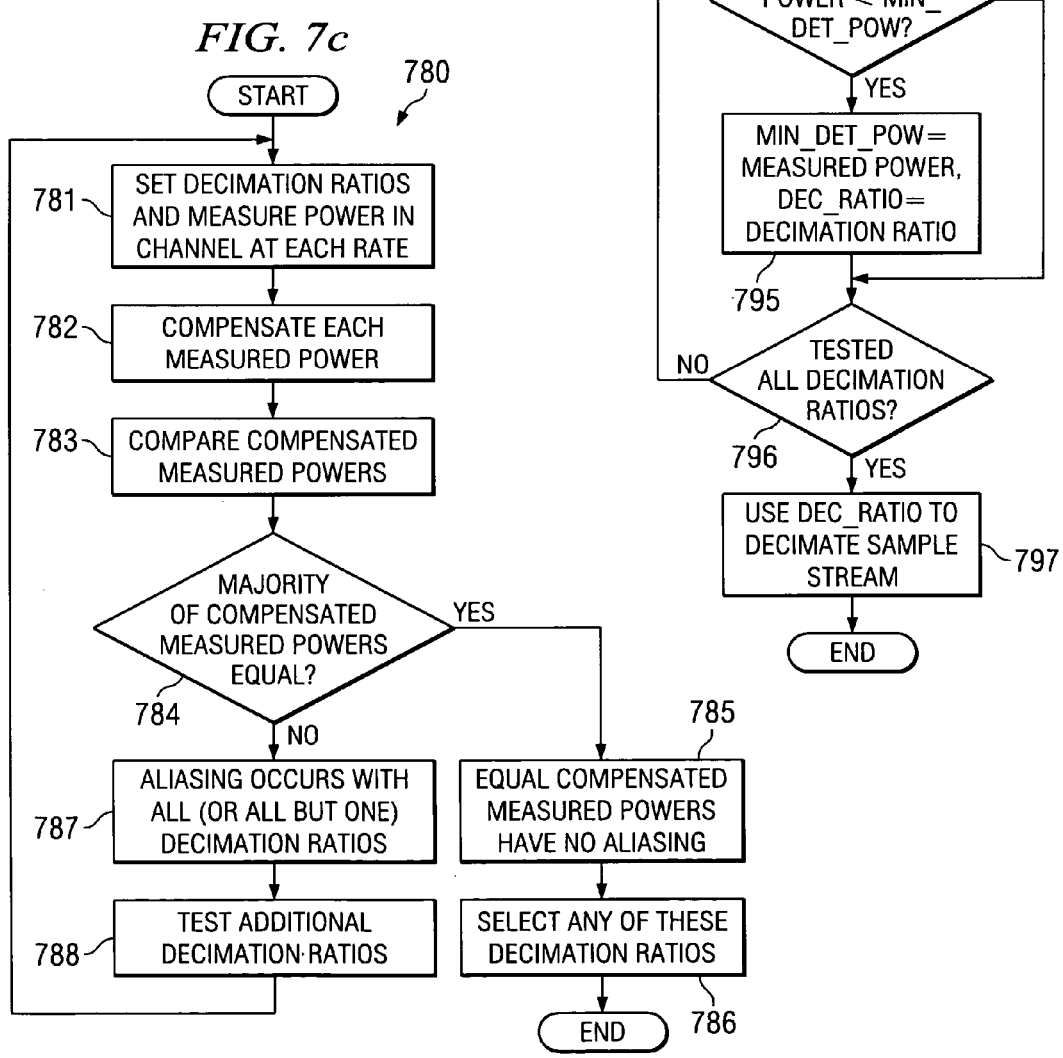

ACTIVE REMOVAL OF ALIASING FREQUENCIES IN A DECIMATING STRUCTURE BY CHANGING A DECIMATION RATIO IN TIME AND SPACE

This application claims priority to application Ser. No. 10/269,349, filed Oct. 11, 2002, which claims priority to a provisional application Ser. No. 60/348,902, filed Oct. 26, 2001. The provisional application is incorporated herein by reference as if the application was reproduced in its entirety herein.

FIELD OF THE INVENTION

This invention relates generally to wireless communications systems and particularly to actively detecting and avoiding and/or removing aliasing frequency components using a configurable decimating ratio.

BACKGROUND OF THE INVENTION

Direct RF is a newly emerging field in wireless digital communications wherein analog RF signals that are transmitted over-the-air are directly sampled into a digital data stream suitable for digital signal processing. A typical wireless digital communications device would use analog filters, duplexors, mixers, analog-to-digital converters (ADC), etc. to convert the analog RF signals into a digital data stream that is suitable for digital signal processing. Unfortunately, analog circuit components, especially components such as capacitors, inductors, resistors, etc. necessary for the analog filters are difficult to integrate into an integrated circuit. This is especially true for the precise values of these components required for use in filters. Of course, the desire of the manufacturer is to maximize the degree of integration for the wireless transceivers. This is because the more highly integrated a wireless transceiver can become, the lower the production costs for the transceiver and the transceiver will typically use less power during operation.

Direct RF involves the direct conversion of the analog RF signal into digital data stream through the use of a direct sampling mixer, without having to undergo any intermediate analog filtering, downconversion, etc. An example of a direct RF sampling mixer is one that uses current to perform its sampling. The current-mode direct sampling mixer converts the received analog RF signal into a current that is then integrated by a sampling capacitor. The charge on the sampling capacitor is then periodically read out to produce the discrete-time data stream. The discrete-time data stream is then converted to a digital data stream by a quantizer or an analog-to-digital converter (DAC).

A common source of impairment or potential impairment that may occur whenever a signal is sampled at a particular sampling rate (or frequency) is aliasing. When a signal is sampled at a particular sampling frequency, Fs, then any part of the signal at a frequency that is greater than Fs/2 will wrap around and combine with the signal at frequencies less than Fs/2. This wrapping around of frequency components greater than Fs/2 is known as aliasing. Therefore, to accurately represent a signal with a certain bandwidth, F, the sampling must be performed at a frequency of at least 2*F. This is known as the Nyquist rate for the signal.

When the signal being sampled has frequency components at frequencies greater than one half of the Nyquist rate, these frequency components are aliased down into the signal and as a result, interference and/or noise is added to the sample stream. A typical way to reduce the aliasing is to use filters, commonly referred to as anti-aliasing filters, to remove any frequency components beyond one half of the Nyquist rate.

However, anti-aliasing filters may be rather complex filters that are difficult to design and integrate onto an integrated circuit. They can be difficult to design if the desired frequency response is sharp. Furthermore, they can be both bulky (consuming a large amount of real estate) and expensive (due to requirements for precise component values). In integrated circuits, it is often not possible to include an anti-aliasing filter on the same integrated circuit containing the sampling circuit and digital circuitry, therefore these filters may be external to the integrated circuit. This requires that the signals go off-chip, reducing the overall performance of the system and introducing additional complexity. Additionally, anti-aliasing filters are static in nature, meaning that their frequency response is set when they are designed and fabricated and cannot be changed to meet changing spectral environments. For example, should operating conditions change such that a formerly low-powered, frequency component that was aliasing into a band of interest but had been previously ignored due to its low power, now for some reason becomes a significant source of interference, a static anti-aliasing filter will not be able to adapt to eliminate that particular aliasing frequency component. Note that the term frequency band of interest may represent a single communications channel or a group of communications channels, typically adjacent.

A need has therefore arisen for a method and apparatus that is capable of detecting aliasing frequency components, determine their effect to the signal within the frequency band of interest, and eliminate the aliasing frequency components.

SUMMARY OF THE INVENTION

In one aspect, the present invention provides a method for aliased interferer avoidance comprising the steps of computing a first power at a frequency band of interest based on a first decimated sample stream, computing a second power at the frequency band of interest based on a second decimated sample stream, determining a decimating ratio without aliased interferers in the frequency band of interest, and using the determined decimating ratio to generate a decimated sample stream.

In another aspect, the present invention provides a method for aliased interferer elimination comprising the steps of computing a first power at a frequency band of interest based on a first decimated sample stream, computing a second power at the frequency band of interest based on a second decimated sample stream, determining the presence of aliased interferers in the frequency band of interest, and compensating for the aliased interferers if any exist.

In yet another aspect, the present invention provides a programmable sample stream decimating circuit comprising a programmable clock generator to generate a clock at a specified frequency, a digital control unit (DCU) coupled to the programmable clock generator, the DCU comprising a programmable timing generator to generate clock signals, and a plurality of sampling capacitors coupled to the digital control unit, each sampling capacitor is coupled to a radio frequency (RF) source and passes an RF signal produced by a RF source when it is activated by a clock signal from the DCU.

In another aspect, the present invention provides a wireless communications device comprising an antenna to receive and transmit radio frequency (RF) signals, a RF transceiver coupled to the antenna, the RF transceiver containing circuitry to convert RF signals into a digital data stream, the RF transceiver comprising a current-mode sampling mixer, the mixer comprising at least one programmable sample stream decimating circuit coupled to the antenna, the sample stream decimating circuit containing circuitry to decimate RF signals by a settable decimating ratio to produce a decimated sample stream, a digital baseband (DBB) controller coupled to the RF transceiver, the DBB controller containing circuitry to digitally process the digital data stream provided by the RF transceiver and convert it into user usable data, and a memory coupled to the DBB controller, the memory containing storage elements to store data and programs.

In yet another aspect, the present invention provides a method for aliased interference avoidance comprising the steps of decimating a sample stream using k different decimating ratios, where k is a number, measuring a signal power level at a frequency band of interest for each of the k decimated sample streams, selecting a minimal measured signal power level, and using a decimating ratio that is associated with the minimal measured signal power level in further decimation The present invention provides a number of advantages. For example, use of a preferred embodiment of the present invention permits active detection and elimination and/or avoidance of aliasing frequency components. Active detection and elimination and/or avoidance of aliasing frequency components allow the present invention to detect an aliasing frequency that was heretofore undetected or unexpected. The aliasing frequency can then be eliminated or avoided.

Also, use of a preferred embodiment of the present invention requires no additional hardware, such as an anti-aliasing filter. Analog anti-aliasing filters require a large amount of real estate on an integrated circuit and are expensive due to the precise values of their components. Digital anti-aliasing filters require additional processing power from a digital signal processor to implement and additional processing power requires additional power consumption and heat dissipation. By not requiring any additional hardware, use of a preferred embodiment of the present invention saves on both the real estate and the power consumption of the integrated circuit.

Additionally, use of a preferred embodiment of the present invention allows the detection of interferers and in lightly loaded systems, it is possible to avoid the interferers by shifting operating frequencies rather than having to actively eliminate the interferer.

BRIEF DESCRIPTION OF THE DRAWINGS

The above features of the present invention will be more clearly understood from consideration of the following descriptions in connection with accompanying drawings in which:

FIG. 1 illustrates a frequency response plot displaying the effects of different decimating ratios on a discrete-time sample stream according to a preferred embodiment of the present invention;

FIGS. 2a-c illustrate the effects of different decimating ratios on the aliasing of interferers located at different frequencies according to a preferred embodiment of the present invention;

FIGS. 3a and 3b illustrate prior art embodiments of current-mode sampling mixers;

FIG. 3c illustrates a prior art embodiment of a voltage-mode sampling mixer;

FIG. 4 illustrates a prior art embodiment of a current-mode sampling mixer with cyclic charge read out;

FIG. 5 illustrates a current-mode sampling mixer with recursive operation to provide infinite-impulse response filtering according to a preferred embodiment of the present invention;

FIGS. 6a and 6b illustrate the use and timing of a current-mode sampling mixer with two banks of rotating capacitors with separate RF switches according to a preferred embodiment of the present invention;

FIGS. 7a-d illustrate algorithms for the detection and elimination and avoidance of aliased interferers using multiple decimating ratios according to a preferred embodiment of the present invention;

DETAILED DESCRIPTION OF ILLUSTRATIVE EMBODIMENTS

Figure 8A:
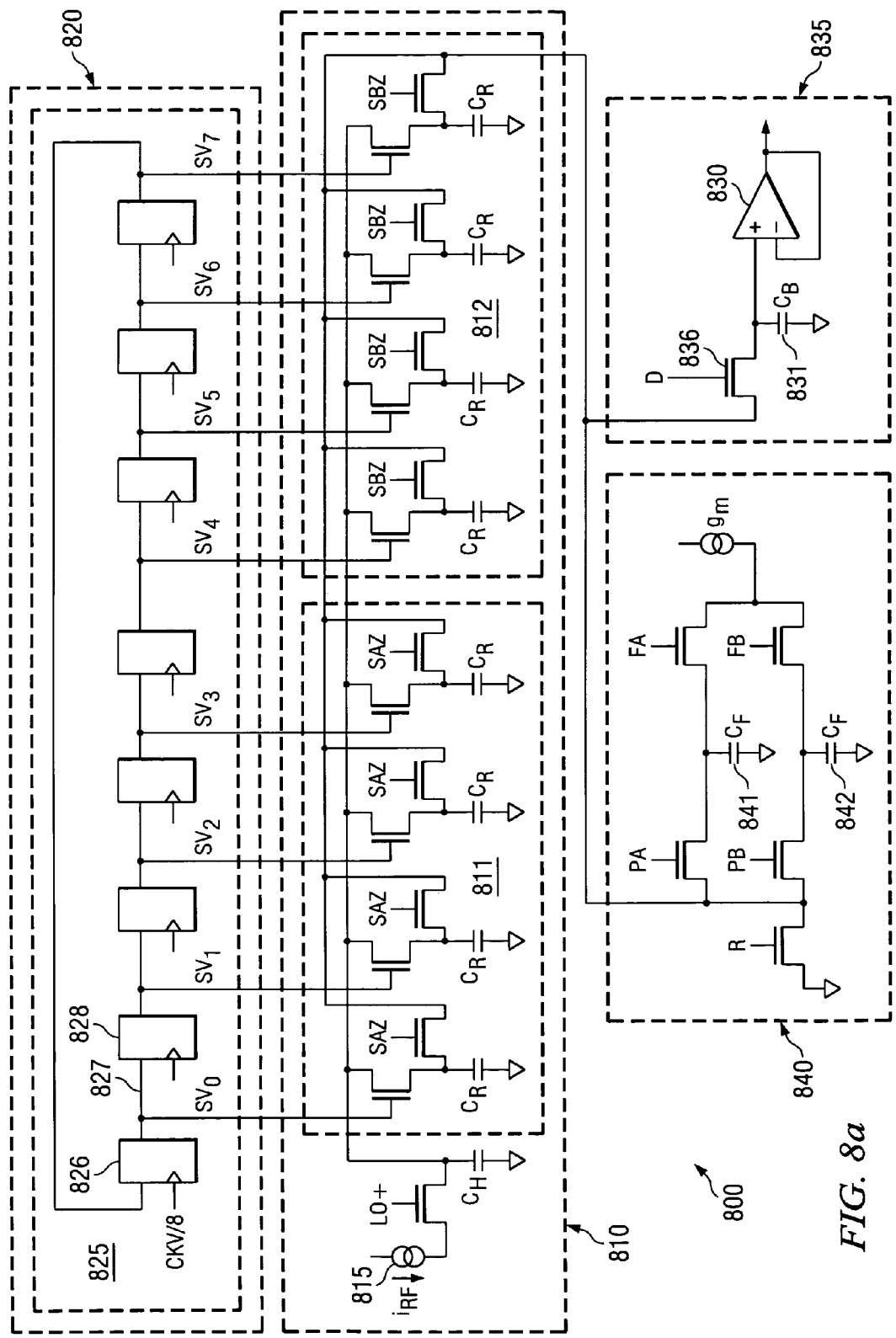
FIGS. 8a and 8b illustrate a current-mode sampling mixer featuring a programmable sampling and decimating circuit along with a programmable control circuit generator according to a preferred embodiment of the present invention.

The making and use of the various embodiments are discussed below in detail. However, it should be appreciated that the present invention provides many applicable inventive concepts, which can be embodied in a wide variety of specific contexts. The specific embodiments discussed are merely illustrative of specific ways to make and use the invention, and do not limit the scope of the invention.

The following discussion focuses on a particular type of radio receiver mixer and its circuitry that is operating in a 2.4 Gigahertz frequency band and is adherent to the Bluetooth technical standards. The Bluetooth technical standard specifies a short-range wireless communications network whose intended purpose is a low-power and low-cost replacement for physical cabling. The Bluetooth technical standard is specified in a document entitled "Specification of the Bluetooth System, Version 1.1, Feb. 22, 2001," which is incorporated herein by reference. While the discussion focuses on Bluetooth radios, the present invention is operable in other frequency bands and other technical standards, therefore, the discussion should not be construed as limiting the present invention to Bluetooth transceivers operating at 2.4 Gigahertz. For example, the present invention has application in global positioning systems (GPS), low-earth orbit satellite system based communications systems and cellular based communications systems. The cellular based systems may include first, second, and third generation (and beyond) digital phone systems, time-division multiple access (TDMA), code-division multiple access (CDMA), global system for mobile communications (GSM) technology along with other digital communications technologies operating at various carrier frequencies. Additionally, the receiver mixer of the present invention has application in wired receivers as well.

Referring now to FIG. 1, a frequency plot illustrates the filtering effects of different decimating ratios on the frequency spectrum of a discrete-time sample stream according to a preferred embodiment of the present invention. There are actually two ways to decimate a sample stream. A first involves the discarding of samples while a second averages the samples. In the discarding of samples, the decimating ratio specifies the number of samples discarded from a sample stream. For example, a decimating ratio of 5 implies that out of every five samples, four are discarded, while a decimating ratio of 8 implies that seven out of every eight samples is discarded. In the averaging of samples, the decimating ratio specifies the number of samples to be averaged to produce a single sample. For example, a decimating ratio of 5 implies that every five samples are to be combined to produce a single sample. Intuitively, the higher the decimating ratio, the more information is loss (unless the original sample stream was highly oversampled), since a larger number of samples are used to produce a single sample.

A side effect of decimating a sample stream is that high-frequency components are aliased down into a frequency band with a bandwidth of less than one half the sampling frequency. For example, if an upper band of a frequency of interest is located at $f_0$, then for a given decimating ratio N, frequency components located above $f_0/2N$ hertz will be aliased below $f_0/2N$. Once again, a frequency band of interest may represent a single communications channel or a group of communications channels, typically adjacent. Clearly, the larger the decimating ratio (larger values of N), the lower the $f_0/2N$ frequency. Hence, larger decimating ratios result in larger amounts of aliasing. This is due to a larger number of frequency components (frequency components $>f_0/2N$) being aliased into a smaller frequency band (0, $f_0/2N$).

A first curve 110 displays the filtering effect for a discrete-time sample stream that is decimated by a decimation ratio of 7, a second curve 120 displays the filtering effect for the same sample stream when it is decimated by a decimating ratio of 8, and finally, a third curve 130 displays the filtering effect for the same sample stream after it is decimated by a decimating ratio of 9. Clearly, the three curves show that for higher values of decimating ratios, different characteristics of the filtering effects appear at lower frequencies. This is a direct result of the aliasing. While increased aliasing can be a disadvantage, it is possible to use the aliasing of different frequency components from the different decimating ratios to detect the presence of interferers and then eliminate them. For example, it may be possible to use a lower than intended decimating ratio to determined if there are interferers present outside of a desired frequency band that are being aliased into the desired frequency band when a higher decimating ratio is used. This is possible since a lower decimating ratio results in both a larger final frequency band and less overlapping of the aliased high frequency components.

Referring now to FIGS. 2a-c, frequency maps illustrate the effects of sampling on a discrete-time sample stream and its intended frequency components along with possible interferers located at frequencies throughout a frequency band according to a preferred embodiment of the present invention. The effect is similar to what occurs with decimation ratios and may be used to describe the effect of decimation ratios as well. The figures illustrate the effects of different sampling rates on interferers that prior to decimation of the sample stream lay outside of the frequency band of interest, but after the sample stream is sampled at a particular sampling rate, the interferers are aliased into a desired frequency band. For example, the FIGS. 2a-c show frequency components at different carrier modulated frequencies $F_0$, $F_1$, etc. These individual carrier modulated frequencies may be thought of as separate communications channels. Alternatively, the figures may be thought of as displaying frequency components at different frequencies in a continuous frequency plot. The continuous frequency plot may be thought of as being frequency bands and a desired communications channel (or a desired frequency range) may be thought of as a frequency band of interest.

Referring now to FIG. 2a, a frequency map 200 displays a signal 202 located in a communications channel $F_0$ and several interferers. A first interferer 204 is located in a communications channel $F_1$, a second interferer 206 is located in a communications channel $F_8$ and a third interferer 208 is located in a communications channel $F_{16}$. Note that although they are being referred to as interferers, the signals in channels $F_1$, $F_8$, and $F_{16}$ may be communications between other devices and would not normally classified as interferers. Regardless of the fact that these signals from channels $F_1$, $F_8$, and $F_{16}$ are interferers or actual communications between other devices, if they alias down into channel $F_0$, they will damage the signal in channel $F_0$.

FIG. 2a may be thought of as presenting a randomly taken snap-shot of a frequency range of a communications medium, such a communications medium for a wireless or wired communications network. As displayed in FIG. 2a, the desired frequency band is the signal 202 located in the channel $F_0$ and the other frequency components present in the frequency plot 200 may be-other signals transmitted by other communications devices and/or they may be interferers generated by noise sources operating in the general vicinity. FIG. 2a may represent a typical frequency map of a communications medium in a communications network under normal operating conditions.

Referring now to FIG. 2b, a frequency map displays the signals in the same communications medium displayed in FIG. 2a as a discrete-time sample stream representing the communications medium is being sampled at an effective sampling rate of R1 according to a preferred embodiment of the present invention. When being sampled at a sampling rate of R1, frequency components with a frequency greater than R1 are folded over and added to the frequency band less than R1. As illustrated in FIG. 2b, frequency R1 lies between communications channels $F_7$ and $F_8$. When sampled at a sampling rate of R1, the frequency component 206 at communications channel $F_8$ is folded down to communications channel $F_0$, for example. As is the frequency component 208 at communications channel $F_{16}$. Clearly the sampling rate of R1 is a poor choice in this particular example since two higher frequency components (one at $F_8$ and another at $F_{16}$) are folded down and aliased onto the signal 202 at $F_0$. These two frequency components will corrupt the signal 202 at $F_0$ and result in poor system performance.

FIG. 2b also displays a combined frequency map 212 showing the net result of the sampling operation with a sampling rate of R1. Frequency plot 212 displays the frequency band from communications channel $F_0$ to $F_3$. The signal 202 at communications channel $F_0$ is now combined with the two aliased higher frequency components (signals 206 and 208). The final result is a signal at $F_0$ that is considerably larger than the original signal. Since any high frequency components above communications channel $F_3$ have aliased down into a frequency range between $F_0$ and $F_3$, the combined frequency map 212 has no frequency components above $F_3$.

Referring now to FIG. 2c, a frequency map displays the signals in the same communications medium displayed in FIG. 2a as a discrete-time sample stream representing the communications medium is decimated at a decimating ratio that has an effective sampling rate of R2 according to a preferred embodiment of the present invention. Note that, in this example, the sampling rate of R2 is lower than the sampling rate of R1 (FIG. 2b), meaning that more aliasing will occur since a smaller frequency band is produced by a lower sampling rate. As illustrated in FIG. 2c, frequency R2 lies between communications channels $F_6$ and $F_7$. When sampled at a sampling rate of R2, the signal 206 at communications channel $F_8$ is folded down to communications channel $F_1$, for example. The signal 208 at communications channel $F_{16}$ is folded down to communications channel. $F_2$ however. The reason that the signals 206 and 208 aliases down to a different communications channel is that the different sampling rate changes the size of the final frequency range, from $F_0$ to $F_3$ (four communications channels in size) when sampling rate R1 is used to $F_0$ to $F_2$ plus a half channel width (three and one half communications channels in size) when sampling rate R2 is used. The changed frequency ranges changes the relative positions of the signals 206 and 208 in the repartitioned frequency ranges.

FIG. 2c also displays a combined frequency map 214 showing the net result of the decimation operation at a sampling rate of R2. Combined frequency map 214 displays the frequency band from communications channel $F_0$ to $F_3$. The original signal at communications channel $F_0$ is not combined with the two aliased signals 206 and 208. The final result is a signal at $F_0$ that is the original signal 202. Because there are no signals aliased onto communications channel $F_0$, it is possible to use the sampling rate R2 to determine the frequency, magnitude, and phase of the interferers that are aliased onto communications channel $F_0$ using the sampling rate R1 (FIG. 2b).

Then, using the determined frequency, magnitude, and phase of the interferers (signals 206 and 208), the interferers can be removed from the signal in the communications channel $F_0$ and the original signal 202 can be recovered. According to a preferred embodiment of the present invention, some additional manipulation of the magnitude and phase may need to be performed prior to recovering the original signal. For example, should there be some built-in filtering that would attenuate the higher frequency components unequally, or filter notches that may occur at different positions due to the different sampling rates, or alter the phase of the interferer, then compensation for these filtering effects must be provided for prior to being able to accurately recovering the original signal. According to a preferred embodiment of the present invention, the required compensation may be derived analytically through equations and mathematical expressions. Alternatively, a calibration step may be employed wherein a signal of known characteristics is applied to the sampling mixer and various decimation ratios are applied to the signal. The output is then analyzed and the various depths and positions of the notches and the magnitude and phase of the filtering operations may be measured.

Referring now to FIG. 3a, a block diagram illustrates a prior art embodiment of a current-mode direct sampling mixer 300. The mixer 300 includes an amplifier 310 (sometimes referred to as a low-noise transconductance amplifier (LNTA)), an RF switch 315 driven by a signal 320 generated by a local oscillator (not shown), and a sampling capacitor (Cs) 325. An alternative version of the mixer 300 exists wherein an antenna (not shown) is coupled to the amplifier, the antenna is used to receive analog RF signals transmitted over-the-air. The direct electrical coupling provides a direct signal path from the antenna into the mixer 300.

An analog RF signal that is provided to the mixer 300 (the analog RF signal may be provided to the mixer 300 via a direct wire or cable connection or transmitted over-the-air) in the form of an RF voltage that is then converted into an RF current by the LNTA 310, which has a transconductance gain of $g_m$. The flow of the RF current is switched by the RF switch 315, which is driven by the signal 320 generated by a local oscillator (LO). The frequency of the signal 320 is referred to as a sampling frequency and is commonly denoted $f_s$. The sampling frequency is normally approximately equal to the frequency used to create the analog RF signal.

As displayed in FIG. 3a, when the signal 320 is high, the RF switch 315 is closed, creating a path for the RF current. The RF current is integrated by the sampling capacitor 325, increasing (or decreasing) the charge on the sampling capacitor 325, depending on the direction of the current flow. In order to fully sample the analog RF signal, an identical current-mode sampling mixer with an RF switch that is driven by an inverse (or complement) of the signal generated by the LO is used. The identical current-mode sampling mixer is used to sample the analog RF signal when the current-mode sampling mixer 300 is decoupled from the LNTA 310 by the RF switch 315 when the signal 320 is low.

Referring now to FIG. 3b, a diagram illustrates a prior art embodiment of a current-mode direct sampling mixer 350 used to fully sample the analog RF signal. The mixer 350 is similar to the mixer 300 displayed in FIG. 3a with the addition of an extra RF switch and sampling capacitor. A first RF switch 365 is controlled by a signal 370, which is the same as the signal 320 in the mixer 300 displayed in FIG. 3a. However, a second RF switch 366 is controlled by a second signal 371 that may be thought of as an inverse (or complement) of the signal 370. The two signals 370 and 371 are operating on opposite half-cycles of one another. When one RF switch is on, the other RF switch is off. This configuration allows the mixer 350 to integrate the RF rectified current at all times. The mixer 350, as illustrated in FIG. 3b, is operating in what is known as a pseudo-differential configuration.

Referring back to FIG. 3a, the charge that is integrated on the sampling capacitor 325 is periodically read out to produce a single sampled data value. The frequency of the charge read out can vary from being equal to the frequency of the signal 320 to some integer divisor of the frequency of the signal 320. The periodic reading out of the charge on the sampling capacitor 325 produces a discrete-time sample stream of the analog RF signal.

Unfortunately, when the charge on the sampling capacitor 325 is being read out, the sampling capacitor 325 cannot be used to integrate the RF current, or vice versa. Therefore, the current-mode sampling mixer 300 as displayed in FIG. 3a does not permit the reading of the charge accumulated on its sampling capacitor 325 while the signal 320 is actively switching. Also, the amount of time required to read the charge from the sampling capacitor 325 is typically longer than the amount of time to integrate the RF current, i.e., half of the period of the signal 320. Therefore, it is normally not feasible to attempt a charge read out while the signal 320 is inactive.

Notice that the switches, both RF and non-RF switches, displayed in the figures and discussed in this specifications are displayed as n-type metal oxide semiconductor (NMOS) transistor switches. However, these switches may be made out p-type metal oxide semiconductor (PMOS) or complementary metal oxide semiconductor (CMOS) transistor pass gates as well without loss in performance or generality. Of course, the use of other types of switches may require minor rearrangements of the mixers. However, the rearrangements are minor and are well understood by those of ordinary skill in the art of the present invention.

Referring now to FIG. 3c, a diagram illustrates a prior art embodiment of a voltage-mode direct sampling mixer 380. Note that while FIGS. 3a and 3b illustrate prior art current-mode sampling mixers, it requires only a relatively simple modification to the sampling mixers displayed in these figures to convert them into voltage-mode sampling mixers. FIG. 3c is a voltage-mode version of the current-mode sampling mixer 300 displayed in FIG. 3a. The transconductance amplifier 310 (FIG. 3a) has been replaced with a voltage source 385 and one terminal of the voltage source 385 is tied to electrical ground. In the case of a voltage-mode sampling mixer, the sampling capacitors (for example, sampling capacitor 389) accumulate a charge proportional to the voltage provided by the voltage source 385, $v_{rf}$. An RF switch 387 operates in a manner consistent with the RF switch 315 (FIG. 3a). Voltage-mode sampling mixers of this particular configuration are commonly referred to as sample-and-hold circuits when operated at lower than radio frequencies.

While the remainder of the specifications discloses various embodiments of current-mode sampling mixers, the present invention is equally applicable with voltage-mode sampling mixers with relatively minor modifications, such as those shown in FIG. 3c.

Referring now to FIG. 4, a block diagram illustrates a prior art embodiment of the current-mode sampling mixer 400 with cyclic charge read out. The mixer 400 is essentially the same as the mixer 350 of FIG. 3b. When more than one sampling capacitor is used, the current-mode sampling mixer is sometimes referred to as a multi-tap direct sampling mixer (MTDSM). A second RF switch 420 and sampling capacitor 430 pair allows the task of integrating the RF current to be shared between two sampling capacitors 425 and 430. The RF switches, S1 415 and S2 420, are driven by signals 417 (for switch S1) and 422 (for switch S2). The signals 417 and 422 may be thought of as portions of the signal generated by the LO. For example, the signal 417 may be configured to gate the signal produced by the LO for N cycles and then remain low for the next N cycles and return to gating the LO signal for the next N cycles. The number N is equal to the number of RF cycles the sampling capacitors will integrate the RF current. When the two signals 417 and 422 are combined, the result is the original signal produced by the LO.

When one signal (417 or 422) is gating the signal produced by the LO, the RF switch (415 or 420, respectively) that is controlled by the signal alternates between being closed and open, permitting the RF current to flow to the respective sampling capacitor. When one signal (417 or 422) is gating the signal produced by the LO, the other signal (422 or 417) is low, and the switch associated with the signal is open, not permitting any RF current to reach the sampling capacitor. While one sampling capacitor is busy integrating the RF current, the second sampling capacitor is not integrating the RF current and therefore its charge can be read out. The roles are then reversed to allow the reading of the charge integrated by the first sampling capacitor to be read out. If the capacitance of each of the sampling capacitors is $C_S$, then at any given time, the capacitance seen by the RF current remains $C_S$ because the RF current only sees one sampling capacitor at a time (due to the nature of the signals 417 and 422).

This periodic integration of a number of half-rectified RF samples performs a finite-impulse response (FIR) filtering operation and is sometimes referred to as a temporal moving average (MA). For example, if the number of half-rectified RF samples being integrated in each period is N, then the operation is referred to as a moving average N, or MA-N. The MA-N operation corresponds to an FIR filtering operation with N coefficients, with all coefficients being unity. The FIR filtering operation can be expressed in equation form as:

$$w_i = \sum_{l=0}^{N-1} u_{i-1}$$

Where: $u_i$ is the i-th RF sample and $w_i$ is the accumulated charge on the sampling capacitor. Due to the fact that the MA-N operation is being read out at the lower rate of once per N RF cycles, aliasing occurs with a foldover frequency at $f_0/2N$. FIR filtering and MA-N operations are considered well understood by those of ordinary skill in the art of the present invention and will not be discussed in detail in these specifications.

The current-mode sampling mixer can be further modified to perform an infinite-impulse response (IIR) filtering operation. IIR filtering operations are usually considered to be more powerful filtering operations than FIR filtering operations. Therefore, IIR filtering operations are frequently preferred over FIR filtering operations. IIR filtering operations are considered well understood by those of ordinary skill in the art of the present invention and will not be discussed in detail in these specifications.

Referring now to FIG. 5, a block diagram illustrates a current-mode sampling mixer 500 with recursive operation to provide IIR filtering according to a preferred embodiment of the present invention. According to a preferred embodiment of the present invention, the current-mode sampling mixer 500 uses two different types (in terms of capacitive value) of sampling capacitors. A first type of sampling capacitor is referred to as a history capacitor, denoted $C_H$, and is used to store the "history" of the RF current. According to a preferred embodiment of the present invention, the history capacitor always integrates the RF current, meaning that with exception of the negative half-cycle, the history capacitor continually integrates the RF current. A second type of sampling capacitor is referred to as a rotating capacitor, denoted $C_R$, and is used to periodically integrate the RF current in a manner similar to the sampling capacitors discussed in FIG. 4. Unlike the mixer 400 in FIG. 4, wherein the actual capacitive value of the sampling capacitors was not crucial as long as the sampling capacitors all had the same values, the values of the history and rotating capacitors in the mixer 500 is important. In actuality, the capacitive value of the sampling capacitors in FIG. 4 is used for determining the gain of the sampling operation, but is not vital to the proper operation of the mixer 400.

According to a preferred embodiment of the present invention, the value of the history capacitor is $a_1 * C_S$, where $C_S$ is the value of the sampling capacitor used in the mixer of FIG. 4 and $a_1$ is a constant. Given that the history capacitor has a specified value of $a_1 * C_S$, then it is preferred (for reasons that will be discussed below) that each of the rotating capacitors have a value of $(1-a_1) * C_S$. It is preferred that the ratio of $C_H$ to $C_R$ be approximately 30. As an example, a preferred value for $a_1$ may be 0.9686. Therefore $C_H$ is approximately thirty one (31) times the value of each one of the $C_R$ capacitors, $C_H/C_R \cong 31$.

The mixer 500, as displayed in FIG. 5, has three RF switches 515, 520, and 525. The RF switches are driven by signals 517, 522, and 527 respectively. The signal 517 is the signal generated by the LO while signals 522 and 527 are gated versions of signal 517, similar to signals 417 and 422 from FIG. 4. Therefore, at any given instance in time, the RF current is being integrated by the history capacitor ($C_H$) and one of the two rotating capacitors ($C_R$). Since the capacitance of the history capacitor is $a_1*C_S$ and that of the rotating capacitor is $(1-a_1)*C_S$, then the RF current sees an overall capacitance of $a_1*C_S+(1-a_1)*C_S=C_S$. This is the same capacitance seen by the RF current in the mixer 400 displayed in FIG. 4.

Assuming that each rotating capacitor is active for N cycles, the IIR filtering is arrived at in the following manner: the RF current is integrated over N RF cycles, with the charge being shared on both the history and the active rotating capacitor. The amount of charge on the respective capacitors is proportional to their capacitance. At the end of an N cycle accumulation period, the active rotating capacitor stores $(1-a_1)$ of the total charge, stops further integration, and prepares for reading out its charge. The formerly inactive rotating capacitor joins the history capacitor in the integration process and at the same time obtains $(1-a_1)$ of the charge stored on the $C_H$ capacitor (assuming that the formerly inactive rotating capacitor had no initial charge). If the input charge integrated over the most recent N cycles is $w_j$, then the charge $s_j$ stored in the system at sampling time j can be described as a single-pole recursive IIR equation:

$$s_j = a_1 * s_{j-1} + w_j$$

and the output charge $x_j$ is $(1-a_1)$ times the system charge of the most recent cycle. This is a discrete-time IIR filter operating at $f_0/N$ sampling rate and possesses a single pole, where $f_0$ is the frequency of the signal generated by the LO.

When operating at high frequencies, for example, if the wireless transceiver is designed for use as Bluetooth transceiver, the operating frequency ($f_0$) is 2.4 Gigahertz and if N=8, then the read out frequency is $f_0/N$ or 300 MHz. Although significantly smaller than 2.4 GHz, 300 MHz remains a very high frequency when it comes to reading out the charge on the rotating capacitors, therefore, it is desirable to relax the read out time even more. One way that the period of the read out time may be further increased is by adding additional rotating capacitors, $C_R$, and then reading the charge stored on one of the rotating capacitors while the remaining capacitors continue integrating the RF current.

Referring now to FIG. 6a, a block diagram illustrates the use of rotating capacitor banks 605 and 620 in a current-mode sampling mixer 600 to relax the charge read out time according to a preferred embodiment of the present invention. The mixer 600 is essentially the mixer 500 from FIG. 5 with the addition of several additional rotating capacitors and an additional rotating capacitor bank. According to a preferred embodiment of the present invention, each of the two rotating capacitor banks 605 and 620 contains four rotating capacitors. However, the present invention is equally operable with larger and smaller numbers of rotating capacitors in the capacitor banks, as well as with a different number of capacitor banks.

During normal operation, one of the two rotating capacitor banks 605 or 620 is active at a given time, for example, capacitor bank 605. Within the active capacitor bank 605, one of the rotating capacitors, for example, capacitor 610, is actively sampling the RF current. While the active capacitor bank is integrating the RF current, the other capacitor bank is having the charge on its rotating capacitors read out and then reset. Although the capacitor banks may each have a certain number of rotating capacitors, it is not required that all of them be used to sample the RF current. For example, if there are four rotating capacitors in a capacitor bank, it is possible to use three (or fewer) capacitors out of the four rotating capacitors to integrate the RF current. The number of rotating capacitors being used can be readily controlled and adjusted by control signaling that will be discussed below.

Referring now to FIG. 6b, a timing diagram illustrates the timing of control signals used to integrate the RF current via rotating capacitors according to a preferred embodiment of the present invention. A first timing trace 655 displays the signal generated by the LO. A second timing trace 660 displays a control signal used to activate the sampling of the RF current by a single rotating capacitor, capacitor 610 for example. According to a preferred embodiment of the present invention, when the control signal (as displayed by trace 660) is high, then the rotating capacitor to which it is coupled is active and integrates the RF current. When the control signal is low, the rotating capacitor is inactive and does not integrate the RF current. The time duration that the control signal is high is equal to the number of cycles of the RF current that the rotating capacitor is to integrate. For example, if the rotating capacitor is to integrate four (4) cycles of the RF current, then the control signal will be high for a time equal to four cycles of the LO signal (trace 655).

Similar control signals (displayed, but not numbered) are used to control the remaining rotating capacitors. A third trace 665 displays the capacitor bank read out signal. When the signal is high, the associated capacitor bank is made inactive and the charge on the rotating capacitors is read out. Notice that the time duration when the signal is low, i.e., when the rotating capacitors in the capacitor bank is to integrate the RF current, is partitioned by control signals for the individual rotating capacitors into equally sized portions. For example, in FIG. 6b, there are four rotating capacitor control signals for each capacitor bank, with each control signal controlling a single rotating capacitor, and the active portions of the four control signals evenly divide into fourths the time when the capacitor read out signal is low. If there were only three rotating capacitors, then the time would be evenly divided up into thirds by three control signals. A similar set of control signals are used to control the second capacitor bank.

Alternatively, there may be more rotating capacitors present within a single capacitor bank than being used. For example, a capacitor bank may hold six rotating capacitors and out of the six, four are used. The actual number of rotating capacitors being used is controlled by the control signals, which are generated in a digital control unit. The additional rotating capacitors permit the mixer the ability to vary the number of rotating capacitors being used, to change the performance of the mixer to meet operating requirements. As discussed previously, the number of rotating capacitors being used to integrate the RF current affects the decimating ratio of the sample stream. Therefore, one possible use for varying the number of rotating capacitors used to integrate the RF current is to change the decimating ratio of the mixer.

As discussed earlier, changing the decimating ratio can result in the movement of an aliased interferer from within a frequency band of interest to outside the frequency band of interest. According to a preferred embodiment of the present invention, the decimating ratio can be changed in several ways. A first way is to change the number of LO cycles that a rotating capacitor integrates the RF current and a second way is to change the number of rotating capacitors used to integrate the RF current. By adjusting the decimating ratio, the mixer is able to move interferers in and out of the frequency band of interest and to detect and eliminate them. A third way is to change the frequency of the control signals that are used to control the sampling circuitry. For example, if there are four rotating capacitors, each may normally be configured to integrate the RF current for a number of cycles, for example, four cycles, yielding a net decimation ratio of 16 (4+4+4+4).

However, the control signal for one of the rotating capacitors may be changed so that it stops the rotating capacitor after only three cycles, this will yield a decimation ratio of 15 (4+4+4+3).

The first way disclosed for changing the decimating ratio involves changing the number of LO cycles that a history capacitor and rotating capacitor combination integrates the RF current. For example, if the number of LO cycles is set to eight (8), then the history and rotating capacitor combination can integrate eight cycles of the RF current before the rotating capacitor is decoupled from the history capacitor and a different rotating capacitor is connected. If, for example, the number of LO cycles is changed to seven (7), then the rotating capacitors are rotated after every seven cycles of the RF current. If the remainder of the current-mode sampling mixer system remains the same, then the sampling mixer will generate a single sample every (seven *M) LO cycles rather than one every (eight *M) LO cycles, where M is the number of rotating capacitors per capacitor bank.

The second way disclosed for changing the decimating ratio involves changing the number of rotating capacitors used to integrate the RF current. For example, if the number of rotating capacitors per capacitor bank is six and four of them are being used to integrate the RF current, then the current-mode sampling mixer will generate a single sample every (4*N) LO cycles where N is the number of LO cycles integrated by a single rotating capacitor. If the number of rotating capacitors used to integrate the RF current is changed to five, then the sampling mixer will generate a single sample every (5*N) LO cycles.

Referring now to FIG. 7a, a flow diagram illustrates an algorithm 700 for use in a current-mode sampling mixer to detect and eliminate interferers that are aliased into a frequency band of interest using two decimation ratios according to a preferred embodiment of the present invention. As discussed earlier, the term frequency band of interest may represent a single communications channel or a group of communications channels, typically adjacent. The algorithm 700 may be thought of as an algorithm for the active rejection of the aliased interferers. Preferably, the algorithm 700 can be used in a mixer with a single decimating circuit that does not permit the integrating and decimating of the RF current by different decimating ratios simultaneously. However, with a minor modification, the algorithm 700 can be modified for use in a mixer with multiple decimating circuits that does permit the simultaneous integrating and decimating of the RF current by different decimating ratios. Rather, the algorithm 700 first integrates and decimates the RF current by one decimating ratio and then repeats the operation with other decimating ratios, one at a time. In order to make good comparisons of the results of the decimation, this sequential operation requires that the RF current remain essentially constant during the execution of the algorithm 700 which is not an issue if performed during system initialization or training and the mixer is receiving a RF current with well characterized frequency characteristics.

According to a preferred embodiment of the present invention, the algorithm 700 executes in a control unit, such as a digital control unit, of the mixer. The control unit is normally responsible for the generation of control and timing signals that are used to activate and de-activate rotating capacitors, capacitor banks, charge read out circuitry, etc., but may contain a processing element to perform some required processing. According to a preferred embodiment of the present invention, the processing element may be a microcontroller, a microprocessor, a dedicated or general purpose digital signal processor, or a custom designed application specific integrated circuit. Preferably, the control unit executes the algorithm 700 each time after the system is powered up or reset. Alternatively, should the performance of the system fall below some threshold (perhaps indicating the presence of an interferer), the control unit may execute the algorithm 700 to attempt to improve system performance. According to another preferred embodiment of the present invention, the control unit may execute the algorithm 700 in between the reception of packets. In packetized systems, there is commonly a gap of time between the packet arrivals. Within this time gap, it is possible for the control unit to execute the algorithm 700.

The control unit begins by setting a first decimating ratio and the mixer begins integrating and decimating the RF current for a specified period of time (block 702), producing a decimated sample stream. The amount of time that the mixer integrates and decimates the RF current should be sufficient to obtain a fairly good representation of the frequency spectrum of the RF current. After integrating and decimating the RF current, the control unit measures the power at a particular frequency of interest from within frequency spectrum of the decimated sample stream and saves the data to a memory. The control unit continues by setting the mixer to a second decimating ratio and the mixer begins integrating and decimating the RF current for another period of time (block 704). Once again, the control unit measures the power at the same frequency of interest from within frequency spectrum of the decimated sample stream and saves the data to a memory.

For each measured power, an un-weighing factor must be calculated. This is due to the fact that there is a difference in gain due to the different decimating ratios used. For example, if one decimating ratio that is higher than another, then the measured power would be higher for the higher decimating ratio. The un-weighing factor would be used only to correct for the difference in gain only. The un-weighing factor can be computed before hand and stored for the different decimating ratios that will be used in the algorithm 700 and can be applied during the measurement of the powers. Without the application of the un-weighing factor, two measured powers in the same band of interest would most likely not have the same magnitude even if there were no aliasing of interferers.

The decimation ratios can be arbitrarily chosen, however, to maximize their effectiveness, it is preferred that the decimating ratios chosen be relatively prime with respect to one another. Two numbers are said to be relatively prime with respect to each other if there are no common factors of the two numbers other than the number one. For example, the numbers 4 and 7 are relatively prime, while the numbers 6 and 9 are not relatively prime (with the common factor being 3). Alternatively, the chosen decimating ratios may be chosen so that they are very close to each other, for example, 7 and 8 (although the numbers 7 and 8 are also relatively prime). With the chosen decimating ratios being very close to each other, an interferer will alias down to a same frequency in both discrete-time sample stream only at very large frequencies.

After the control unit has completed the decimation and measurement of the RF current for the two decimating ratios, the measured power at the particular frequency of interest for each of the two decimating frequencies are compared against one another (block 706). With the measured power for decimating ratio one referred to as P1 and so on. If P1 and P2 are equal or approximately equal (within some specified delta of each other) (block 708), then it is determined that there are no aliased interferers (block 710) and the algorithm 700 terminates. If P1 and P2 are not equal, then it is determined that the smaller of the two has no aliased interferers (block 712).

As an added measure of insurance in detecting the aliased interferers, the algorithm 700 features an additional computational step. If one measured power is smaller than the other measured power (block 712), then the control unit calculates the magnitude of the aliased power in the bands that are aliasing into the frequency band of interest. With the frequency band of interest and the decimating ratio(s) known, it is easy to determine the original frequency of the aliasing interferer(s). The magnitude and phase of the aliasing interferer(s) are measured (block 714) and removed (block 716) from the frequency band of interest. Alternatively, the aliasing interferers may be measured using different coordinate systems, such as the Cartesian coordinate system (I and Q). Note that if the aliasing interferers can be accurately characterized regardless of the coordinate system, then it is possible to eliminate them. With the aliasing interferers removed, the measured powers are once again compared, and they should all be equal or approximately equal (block 718).

Ideally, the mixer should use one of the decimating ratios that does not result in the aliasing of an interferer (if any exists) into the frequency band of interest. However, if for some reason the mixer decides to use a decimating ratio that is known to result in the aliasing of interferers into the frequency band of interest, the measured power and phase of the aliasing interferer (from block 714) may be used to eliminate the aliasing interferer from the frequency band of interest.

Referring now to FIG. 7b, a flow diagram illustrates an algorithm 750 for use in a current-mode sampling mixer to detect and eliminate interferers that are aliased into a frequency band of interest using three decimation ratios according to a preferred embodiment of the present invention. The algorithm 750 as displayed is similar to the algorithm 700 displayed in FIG. 7a and is preferably executed in a control unit. The control unit begins by setting a first decimating ratio and the mixer begins integrating and decimating the RF current for a specified period of time (block 752), producing a decimated sample stream. The amount of time that the mixer integrates and decimates the RF current should be sufficient to obtain a fairly good representation of the frequency spectrum of the RF current.

After integrating and decimating the RF current, the control unit measures the power at a particular frequency of interest from within frequency spectrum of the decimated sample stream and saves the data to a memory. The control unit continues by setting the mixer to a second decimating ratio and the mixer begins integrating and decimating the RF current for another period of time (block 754). Once again, the control unit measures the power at the same frequency of interest from within frequency spectrum of the decimated sample stream and saves the data to a memory. Finally, the setting, integrating and decimating, and measuring of the RF current is repeated for a third decimating ratio (block 756). Notice that there is no restriction placed by the algorithm 750 that there be three decimating ratios, however, the use of three decimating ratios provides a good trade-off between the amount of time used to detect and eliminate aliased interferers and the effectiveness of the detection of the aliased interferers themselves.

As few as two decimating ratios may be used (as shown in FIG. 7a) and there is no real limit as to the maximum number of different decimating ratios that may be used, other than performance limitations. As stated above, in the discussion of FIG. 7a, an un-weighing factor must be calculated for each decimation ratio used. Additionally, the decimation ratios can be arbitrarily chosen, however, to maximize their effectiveness, it is preferred that the decimating ratios chosen be relatively prime with respect to one another.

After the control unit has completed the decimation and measurement of the RF current for the three decimating ratios, the measured power at the particular frequency of interest for each of the three decimating frequencies are compared against one another (block 758). With the measured power for decimating ratio one referred to as P1 and so on. If P1, P2, and P3 are all equal or approximately equal (within some specified delta of each other) (block 760), then it is determined that there are no aliased interferers (block 762) and the algorithm 750 terminates.

If one of the measured powers is smaller than the other two measured powers (block 764), then the smallest power is determined to have no aliased interferers (block 766). If two of the measured powers are equal (or approximately equal) and are smaller than the third measured power (block 768), then the smallest measured power is determined to have no aliased interferers (block 766). The use of the three different decimating ratios and the three resulting measured powers allows the use of a "voting" type of decision making. If the measured powers are not all the same value, then there is an aliased interferer, but with less than three decimating ratios only one aliased interferer can be detected. Three different decimating ratios can detect the presence of two aliased interferers and it is highly unlikely that more than two aliased interferers of significant power be present in a communications system.

In general, when three or more decimation ratios are used to help determine the presence of an interferer, the selection of the decimation ratio that does not result in an interferer aliasing down into the frequency band of interest is made by selecting the decimation ratio that results in the smallest measured power. When there are several decimation ratios that result in measured powers that are approximately equal to each other, then it is possible to arbitrarily select any one of these decimation ratios. Alternatively, the decimation ratio that results in the largest measured power which still is in the group of measured powers with the smallest measured power may be selected to maximize the received signal. The selection of the largest measured power within the group of approximately equal measured powers may lead to improved system performance due to the slightly greater signal power, or other reasons.

Once again, as an added measure of insurance in detecting the aliased interferers, the algorithm 750 features an additional computational step. If one measured power is smaller than the other two measured powers (block 764) or two measured powers are smaller than the third measured power (block 768), then the control unit calculates the magnitude of the aliased power in the bands that are aliasing into the frequency band of interest. With the frequency band of interest and the decimating ratio(s) known, it is easy to determine the original frequency of the aliasing interferer(s). The magnitude and phase of the aliasing interferer(s) are measured (block 770) and removed (block 772) from the frequency band of interest. Alternatively, the aliasing interferers may be measured using different coordinate systems, such as the Cartesian coordinate system (I and Q). Note that if the aliasing interferers can be accurately characterized regardless of the coordinate system, then it is possible to eliminate them. With the aliasing interferers removed, the measured powers are once again compared, and they should all be equal or approximately equal (block 774).

Ideally, the mixer should use one of the decimating ratios that does not result in the aliasing of an interferer (if any exists) into the frequency band of interest. However, if for some reason the mixer decides to use a decimating ratio that is known to result in the aliasing of interferers into the frequency band of interest, the measured power and phase of the aliasing interferer (from block 770) may be used to eliminate the aliasing interferer from the frequency band of interest.

According to a preferred embodiment of the present invention, the algorithms 700 and 750 are optimally used when the communications network is operating under light or normal operation conditions, i.e., when the amount of network traffic is light to moderate. When the communications network is operating under heavy traffic conditions, it is likely that every available communications channel or frequency band is occupied, making it difficult to avoid the presence of a signal being aliased down onto the desired communications channel, regardless of the decimating ratio used.

Previously, the discussion has covered the use of sampling capacitors to integrate an RF current and the charge accumulated on the sampling capacitors is read out to provide a sample of the RF current. The number of RF cycles (or indirectly, the amount of time) that a sampling capacitor integrates the RF current to produce a sample of the RF current is in effect a decimation of the RF current. For example, if the sampling capacitor integrates the RF current four times (once per RF cycle) over four RF cycles and then has its charge read out, the RF current is being decimated by a decimation ratio of four. Additional decimation occurs when more than one rotating capacitor is used to integrate the RF current. For example, if there are five rotating capacitors and each one integrates the RF current for a time interval equal to one-fifth of an integration interval and then the charge from one rotating capacitor is read out, then the RF current is being decimated by a decimation ratio of five. It is through the use of these two techniques that the mixer of the present invention can adjust the decimating ratio of its decimating circuitry.

As stated previously, the algorithm 750 displayed in FIG. 7b is designed for execution in a mixer with a single integrating and decimating circuit, hence the sequential testing of three different decimating ratios. A relatively minor modification will permit optimal execution on a mixer with multiple integrating and decimating circuits. Rather than having the mixer configure its integrating and decimating circuit to test a decimation ratio one at a time, the mixer can configure each one of its multiple integrating and decimating circuits to test a different decimating ratio. A benefit of being able to simultaneously test multiple decimating ratios is that the testing can be completed in a shorter period of time. An added benefit of testing multiple decimating ratios simultaneously is that the exact same RF current is being tested, remembering that the sequential testing of the different decimating ratios required that the RF current remain the same or essentially the same during the testing. This restriction is no longer needed if the different decimating ratios can be tested one time.

While active rejection of the aliased interferers is an effective way to avoid and possibly remove the aliased interferers, the tasks involved active rejection, such as measurements of the magnitudes of the aliased interferers prior to their being aliased require a non-zero amount of processing power. Additionally, it requires that the signal being sample be stored so that the aliased interferers may be measured prior to their being aliased into lower frequencies. This, of course, requires storage space.

At moderately high to high frequencies and above, the majority of signals begin to behave like sinusoidal signals. When this occurs, it is possible to combine two (or more) signals together (as in a signal and an aliased interferer(s)) and have a resulting measured power that is smaller in magnitude than any of the signals individually. Therefore, the simple selection of a minimum measured power may not be sufficient to detect a signal without an aliased interferer when this is the case.

Referring now to FIG. 7c, a flow diagram illustrates an algorithm 780 for selecting a decimation ratio that does not result in the aliasing of interferers into a frequency band of interest according to a preferred embodiment of the present invention. As stated above, when dealing with high frequencies, the behavior of signals begin to change and it is possible for several signals to combine together and have the resulting measured power be smaller than any one of the measured powers for the individual signals.

The algorithm 780 is intended to solve this phenomenon. However, its use is not limited to when the operating frequencies exceed some threshold. The algorithm 780 can be used in any situation. Additionally, the concept behind the algorithm 780 can be executed sequentially on a sampling mixer with a single sampling and decimating circuit or in parallel in a sampling mixer with a plurality of sampling and decimating circuits. The discussion will focus on a sampling mixer with a plurality of sampling and decimating circuits. Note that with relatively minor modifications, the algorithm 780 can be made to execute on a sampling mixer with a single sampling and decimating circuit.

According to a preferred embodiment of the present invention, the algorithm 780 executes in the control unit. The algorithm 780 begins with the control unit configuring the plurality of sampling and decimating circuits to decimate the signal at various decimation ratios and once the sampling and decimating circuits are configured, they are permitted to proceed and decimate the signal (block 781). The algorithm 780 requires the use of three or more different decimation ratios. As discussed previously, the decimation ratios should be relatively prime numbers and not low-multiples of one another.

Once the signal has been decimated, a measured power is calculated for each decimated signal stream. After the power in the frequency band of interest is measured in each of the decimated sample streams, the control unit compares the various measured powers (block 783). However, before the measured powers can be compared directly, they must be adjusted to compensate for differing amounts of gain provided by the different decimation ratios used. For example, a measured power from a decimated sample stream that was decimated with a large decimation ratio would have a larger magnitude than one decimated with a small decimation ratio, with everything else being equal. As discussed previously, the adjustment can be performed by applying an un-weighing factor to each of the measured powers. Each un-weighing factor is unique to a particular decimation ratio and can be calculated before hand and stored for later use.

The comparison performed requires that the control unit compares the various compensated measured power and count the ones that are equal in compensated measured power. Note that since it is highly unlikely that the compensated measured powers are exactly equal to one another, the compensated measured powers are considered equal if they are within some specified epsilon of one another.

After the comparison, the control unit determines if there is a majority of compensated measured powers that are equal (block 784). For example, if there are a total of three decimation ratios, then a majority is declared if two or three of the compensated measured powers are equal. If there are a total of four decimation ratios, then a majority is declared if three or four of the compensated measured powers are equal. Note that in the case of four decimation ratios, two equal compensated measured powers may also be a majority if the remaining two unequal compensated measured power are themselves unequal.

If there is a majority of equal compensated measured powers, then the equal compensated measured powers have no aliasing (block 785) and the control unit can select any one of the decimation ratios that resulted in the equal compensated measured powers (block 786). Alternatively, the control unit may select the decimation ratio with the greatest equal compensated measured power to optimized received signal power.

If there is no majority of equal compensated measured powers, then aliasing occurs in all (or all but one) decimation ratios (block 787) and the control unit should select a new set of decimation ratios (block 788) and return to block 781 to repeat the test with the new set of decimation ratios.

Referring now to FIG. 7d, a flow diagram illustrates an algorithm 790 for selecting a decimation ratio that does not result in the aliasing of interferers into a frequency band of interest according to a preferred embodiment of the present invention. The algorithm 750 (FIG. 7b) may be thought of as an algorithm for the active avoidance of aliased interferers. As in the case of the algorithm 750 (FIG. 7b) for the active rejection of aliased interferers, the concept behind the algorithm 790 can be executed sequentially on a sampling mixer with a single sampling and decimating circuit or in parallel on a sampling mixer with a plurality of sampling and decimating circuits. The discussion will focus upon a sampling mixer with a plurality of sampling and decimating circuits. Notice that with relatively minor modifications, the algorithm 780 can be made to execute on a sampling mixer with a single sampling and decimating circuit.

As with the algorithm 750 (FIG. 7b), the algorithm 790 executes in the control unit. The algorithm 790 begins with the initialization of several variables (block 791) that are needed during the execution of the algorithm 790. The variables being initialized include "MIN_DET_POW" and "DEC_RATIO". The variable "MIN_DET_POW" is used to store a minimal detected power and is initialized to a very large number, for example, infinity. The variable "DEC_RATIO" is used to store a decimation ratio whose application resulted in the minimal detected power and for simplicity, is initialized to zero. According to a preferred embodiment of the present invention, the variable "DEC_RATIO" can be initialized to any value.

With the variables initialized, the control unit configures the plurality of sampling and decimating circuits to decimate the signal (block 792), each sampling and decimating circuit to decimate the signal with a different decimation ratio. According to a preferred embodiment of the present invention, the preferred number of decimation ratios is three, although the algorithm 790 may operate with as few as two decimation ratios and there is no limit on the maximum number of decimation ratios other than practical limits. Once all sampling and decimating circuits are configured, they are permitted to proceed and decimate the signal. Once complete, a signal power is measured for each decimated sample stream (block 793). The power is measured at a particular frequency band of interest, for example, a communications channel that is to be used for communications by a device coupled to the sampling mixer. According to a preferred embodiment of the present invention, each decimated sample stream is saved by the control unit as they are being generated and the control unit simply measures the signal power once the sampling and decimating circuits are complete. Alternatively, each sampling and decimating circuit has its own storage capability and it can also perform the measurement of the signal power.

After the power in the frequency band of interest is measured in each of the decimated sample streams, the control unit enters a loop to determine the decimation ratio that resulted in the minimal measured power. However, before the measured powers can be compared directly, they must be adjusted to compensate for differing amounts of gain provided by the different decimation ratios used. For example, a measured power from a decimated sample stream that was decimated with a large decimation ratio would have a larger magnitude than one decimated with a small decimation ratio, with everything else being equal. As discussed previously, the adjustment can be performed by applying an un-weighing factor to each of the measured powers. Each un-weighing factor is unique to a particular decimation ratio and can be calculated before hand and stored for later use.

After the un-weighing, the control unit can make direct comparisons of the measured powers. The control unit compares a first measured power against the variable "MIN_DET_POW" (block 794) and if the first measured power is less than the current value of "MIN_DET_POW", then the control unit sets "MIN_DET_POW" to be equal to the first measured power and "DEC_RATIO" to be equal to the particular decimation ratio used to create the decimated sample stream resulting in the first measured power (block 795). According to a preferred embodiment of the present invention, all of the measured powers are checked against "MIN_DET_POW" to determine the minimum measured power. The control unit then checks to see if it has tested all of the decimation ratios (block 796). If not all of the decimation ratios have been tested, then the control unit jumps back to block 792 to test remaining decimation ratios.

If the control unit has checked all of the measured powers, then the control unit will configure the sampling and decimating circuitry in the sampling mixer to use the decimation ratio "DEC_RATIO" (block 797) since it has found the decimation ratio that resulted in the minimal signal level in the frequency band of interest.

According to a preferred embodiment of the present invention, the algorithm 790 as discussed will use a decimation ratio that resulted in the minimal measured power. If there is more than one decimation ratio that results the same minimal measured power, then the algorithm 790 will select the first one that it found. Alternatively, the algorithm 790 may be configured to randomly select from any of the decimation ratios that resulted in the minimal measured power. Additionally, the algorithm 790 may be configured to select the smallest decimation ratio that resulted in the minimal measured power to produce a decimated sample stream that is minimally decimated. According to another preferred embodiment of the present invention, the largest decimation ratio that resulted in the minimal measured power may be selected to minimize the amount (number) of samples being provided to the device coupled to the sampling mixer. In yet another alternative, the decimation ratio that results in the largest measured power which still is in the group of measured powers with the smallest measured power may be selected to maximize the received signal. The selection of the largest measured power within the group of approximately equal measured powers may lead to improved system performance due to the slightly greater signal power.

Referring now to FIG. 8a, a block diagram illustrates a portion of a current-mode sampling mixer 800 with a single RF current accumulating circuit 810 according to a preferred embodiment of the present invention. The mixer 800 has a single RF current accumulating circuit, which with minor modifications can be changed into a sampling and decimating circuit. With one sampling and decimating circuit (formerly the RF current accumulating circuit 810), to measure the effect of different decimating ratios, the measurements are performed sequentially (using an algorithm such as one described in FIG. 7a). The mixer 800 includes the sampling and decimating circuit 810, a transconductance amplifier (TA) 815 coupled to the sampling and decimating circuit 810, digital control unit (DCU) 820, and an output amplifier 830.

The TA 815 provides the RF current to the sampling and decimating circuit 810 where it is sampled and decimated. According to a preferred embodiment of the present invention, the sampling and decimating circuit 810 has two rotating capacitor banks 811 and 812, with four rotating capacitors in each capacitor bank, although there isn't an actual limit on the number of rotating capacitors in a capacitor bank. The DCU 820 controls the activation and de-activation of the rotating capacitors through control signals that it generates. The DCU 820, through its control signals, can use all of the rotating capacitors (each rotating capacitor bank in FIG. 8a features four rotating capacitors) or some number less than that in the integration of the RF current. As discussed previously, the use of all four rotating capacitors within a single capacitor bank results in a decimating ratio of four. In addition to controlling the number of rotating capacitors used, the DCU 820 controls the number of RF cycles that each one of the rotating capacitors integrates the RF current. For example, if each rotating capacitor integrates the RF current for five RF cycles, then the decimating ratio is five. The two decimating ratios are multiplied together to provide an overall decimating ratio of the sampling and decimating circuit 810. In the examples above, the overall decimating ratio would be four times five, or twenty (4×5=20). The decimated sample stream is outputted through the output amplifier 830.

The DCU 820 uses a structure commonly referred to as a circular shift register 825 with a rotating bubble to generate the control signals for activating and de-activating the rotating capacitors. Notice that the circular shift register 825 has a programmable shift length, i.e., the circular shift register can be configured as to how many registers in its shift chain are to be used. A discussion of two possible embodiments of the programmable circular shift register will be presented below. Other circuits exist in the DCU 820, but are not shown. These circuits may include: a control unit for controlling the signal generators (the control unit may be a microprocessor, a microcontroller, etc.), clock generators and dividers, other signal generators, etc. The bubble shift register is made up of memory cells coupled into a circular sequence, with the output of one memory cell becoming an input of the next memory cell. For example, a memory cell 826 has an output 827 that becomes the input for a memory cell 828. The output of each memory cell is also connected to a single rotating capacitor in the sampling and decimating circuit 810. According to a preferred embodiment of the present invention, when the content of a memory cell is high (for example, a binary one), the rotating capacitor connected to the output of the memory cell is active. According to a preferred embodiment of the present invention, the outputs of the individual memory cells can be reconfigured in order to lengthen or shorten the bubble shift register, depending on the number of rotating capacitors being used to integrate the RF current.

Figure 8B:
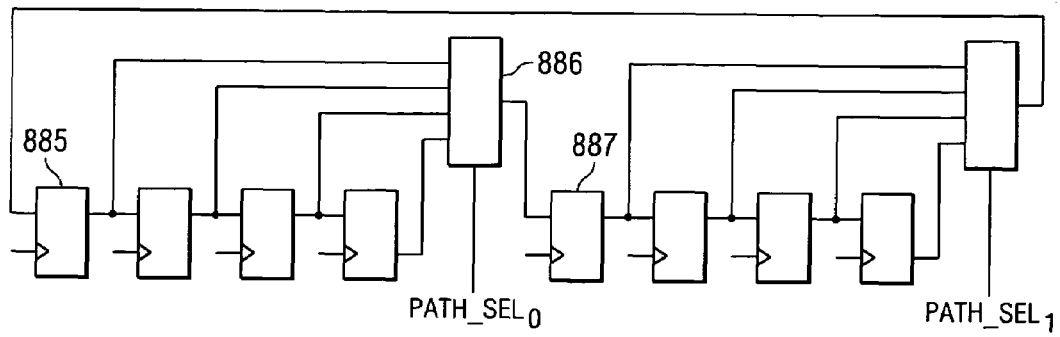

Referring now to FIG. 8b, a block diagram illustrates a detailed view of a circular shift register 825 with a programmable shift length according to a preferred embodiment of the present invention. The circular shift register 825 presented in FIG. 8b features a single multiplexer, for example, multiplexer 886, that is located at the end of a sequence of registers used to control the rotating capacitors within a single rotating capacitor bank. According to a preferred embodiment of the present invention, the multiplexer has M inputs, where M is the number of rotating capacitors in the rotating capacitor bank. For example, FIG. 8b displays the circular shift register 825 for a mixer with two rotating capacitor banks with four rotating capacitors per bank, therefore, the multiplexers are located between the fourth and fifth registers and the eight and the first registers. The inputs of the multiplexer are the outputs of the registers and the output of the multiplexer is the input of the register responsible for controlling the first rotating capacitor of the next capacitor bank, for example, register 887. The multiplexer has a select line that is used to select which register's output to present to the input of the first register of the next capacitor bank. Of course, if there are more than two inputs, then there needs to be at least $\log_2(k)$ bits in the select line, where k is the number of inputs to the multiplexer. For example, in FIG. 8b, if only one rotating capacitor per capacitor bank is to be used, the select line to the multiplexer 886 would select the output of register 885 to present to the input of the register 887.

Referring back to FIG. 8a, the DCU 825 features the circular shift register 825 that is made up of a series of memory cells that are all driven by a clock labeled "CKV/8". Note that there are two rotating capacitor banks 811 and 812. The two banks are present to ensure that there is always one rotating capacitor bank available for integrating the RF current while the other is having its charge read out. It is possible to have each of the memory cells (for example 826 and 828) be driven by independent and programmable clocks. For example, memory cell 826 may be driven by a clock that had a period equal to eight RF cycles while memory cell 828 has a clock that had a period equal to seven RF cycles. The independent clocks can be programmed to create any arbitrary decimation ratio. For example, in FIG. 8a, if each memory cell was driven by a clock that had a period of eight RF cycles, then the decimation ratio would be 32 (8×4). However, if one of the memory cells controlling one of the rotating capacitors in each of the two rotating capacitor banks, for example, memory cell 826 (and its corresponding memory for the second rotating capacitor bank), was driven by a clock with a period of seven RF cycles and the remaining memory cells had clocks with a period of eight RF cycles, then the decimation ratio would be 31 (7+3×8).

Figure 9A:
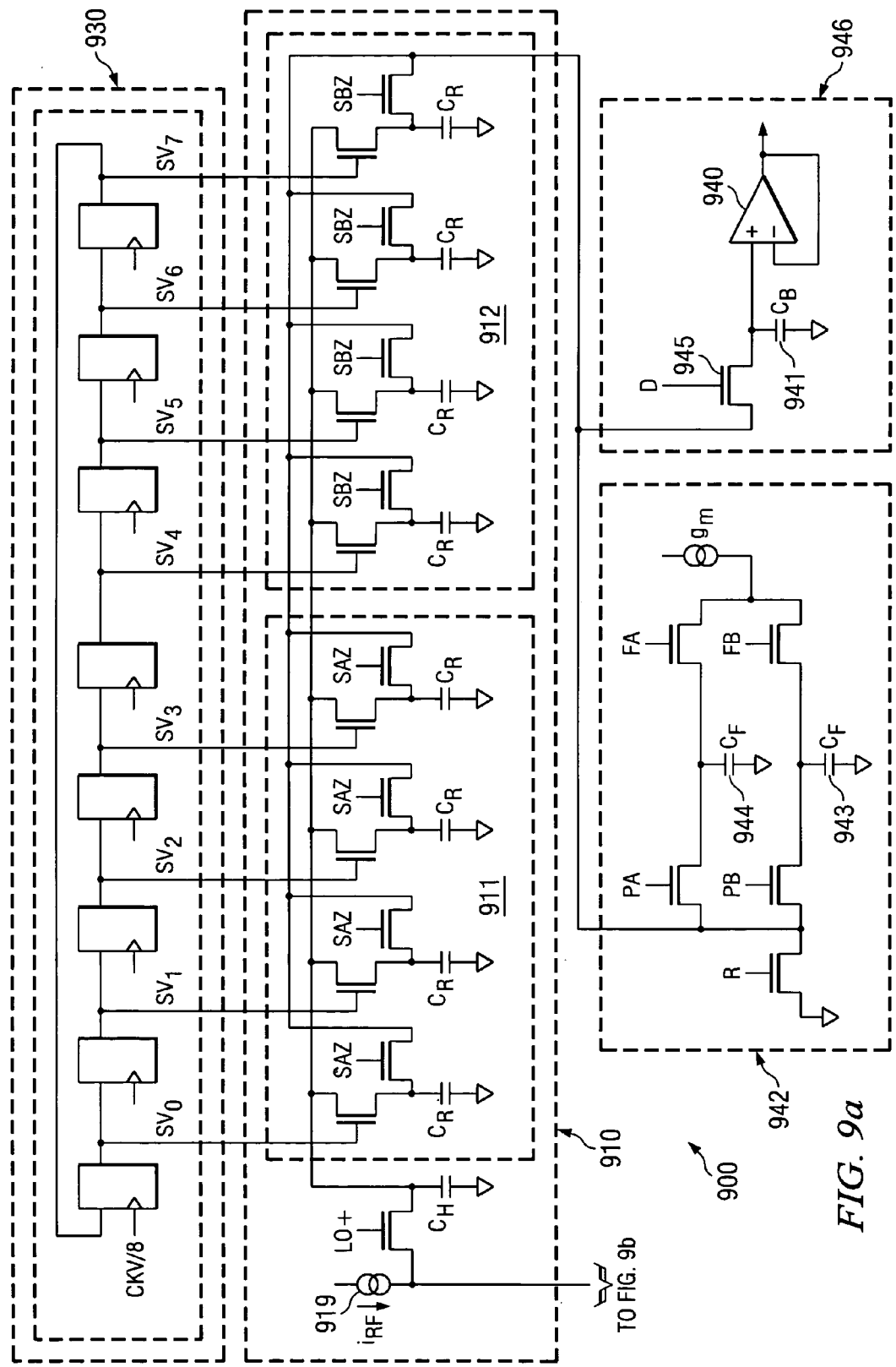
FIG. 9 illustrates a current-mode sampling mixer with two programmable sampling and decimating circuits according to a preferred embodiment of the present invention.
Figure 9B:
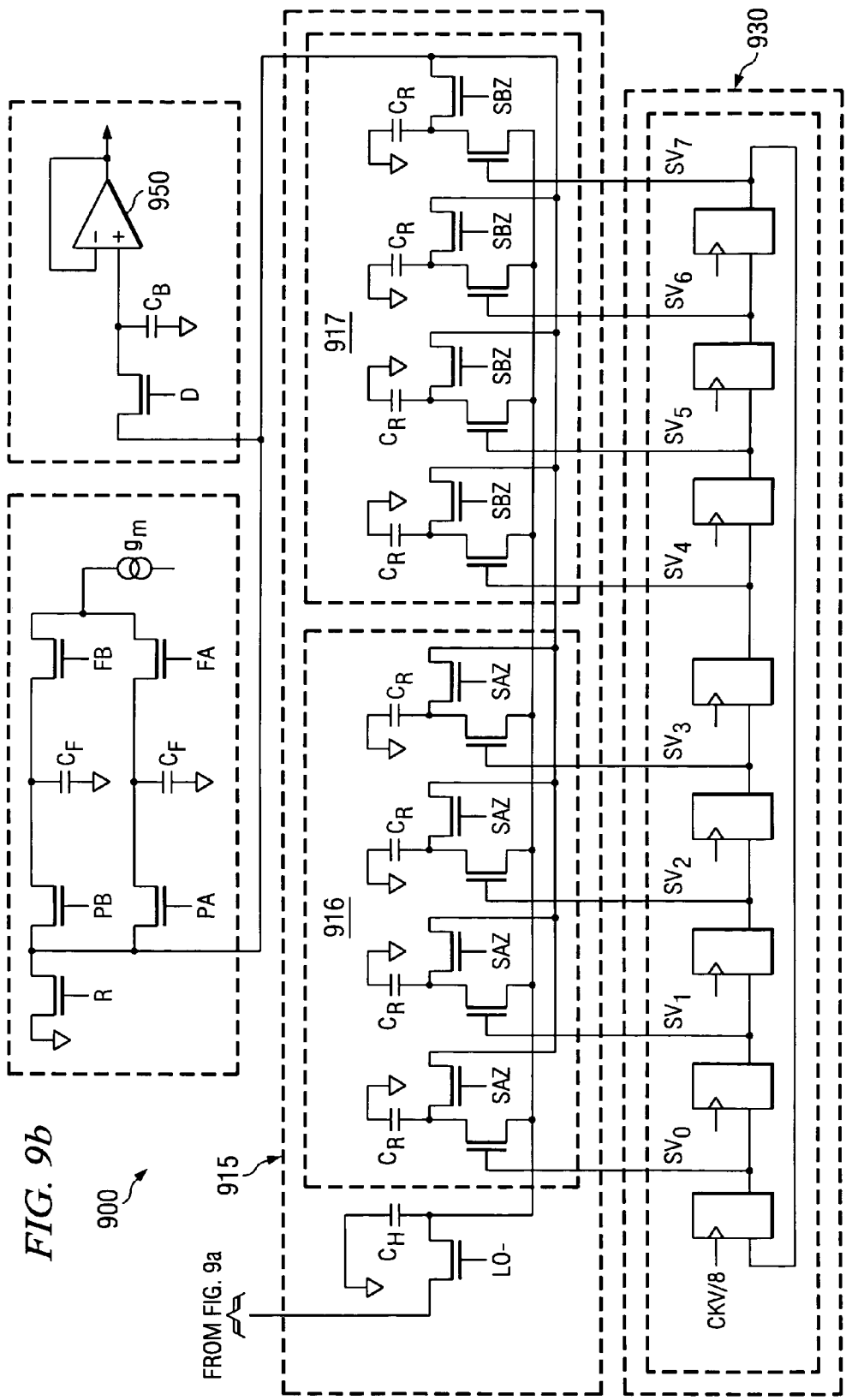

Referring now to FIG. 9, a block diagram illustrates a portion of a current-mode sampling mixer 900 with two RF current accumulating circuits 910 and 915 according to a preferred embodiment of the present invention. The mixer 900 is similar to the mixer 800 displayed in FIG. 8, with the exception that there are two RF current accumulating circuits 910 and 915, rather than one. As displayed, FIG. 9 illustrates two signal paths in a pseudo-differential mode mixer (the I+ and I− paths are displayed and the Q+ and Q− paths are not displayed). With minor modifications, the two RF current accumulating circuits 910 and 915 can be converted into operating in single ended mode. Additionally, the RF current accumulating circuits 910 and 915 can also operate as sampling and decimating circuits.

With two sampling and decimating circuits (formerly RF current accumulating circuits 910 and 915), the mixer 900 can simultaneously integrate and decimate the RF current with two different decimating ratios. Each of the two sampling and decimating circuits 910 and 915 is controlled by a digital control unit (DCU) 930 that is similar to the DCU 820 discussed in FIG. 8. Although displayed as two separate entities, the DCU 930 controlling the two sampling and decimating circuits may be contained in one single unit. For illustrative purposes, however, the DCU 930 is separated into two to simplify the illustration and to reduce the number of lines crossing the figure. Although the two sampling and decimating circuits 910 and 915 are controlled by the same DCU 930, each is controlled by a separate bubble shift register. This is so that each sampling and decimating circuit can integrate and decimate the RF current with a different decimating ratio. Alternatively, each sampling and decimating circuit may have its own separate DCU.

A transconductance amplifier (TA) 919 provides almost the same RF current to the two sampling and decimating circuits 910 and 915 simultaneously. Since each sampling and decimating circuit is receiving the same RF current, the decimation operation can occur in parallel and the frequency responses measured can be more readily compared. As illustrated, each of the two sampling and decimating circuits 910 and 915 has two rotating capacitor banks (911 and 912 for circuit 910 and 916 and 917 for circuit 915). Because each sampling and decimating circuit can operate with different decimating ratios, the DCU 930 has a dedicated circular shift register with rotating bubble for each sampling and decimating circuit. The remainder of the mixer 900 is essentially the same as the mixer 800 discussed in FIG. 8. According to a preferred embodiment of the present invention, the mixer 900 may have any number of sampling and decimating circuits, although FIG. 9 displays the mixer 900 with two such circuits. With each additional sampling and decimating circuit, the mixer 900 is capable of simultaneously testing more decimating ratios while trading off physical size and power consumption.

Figure 10:
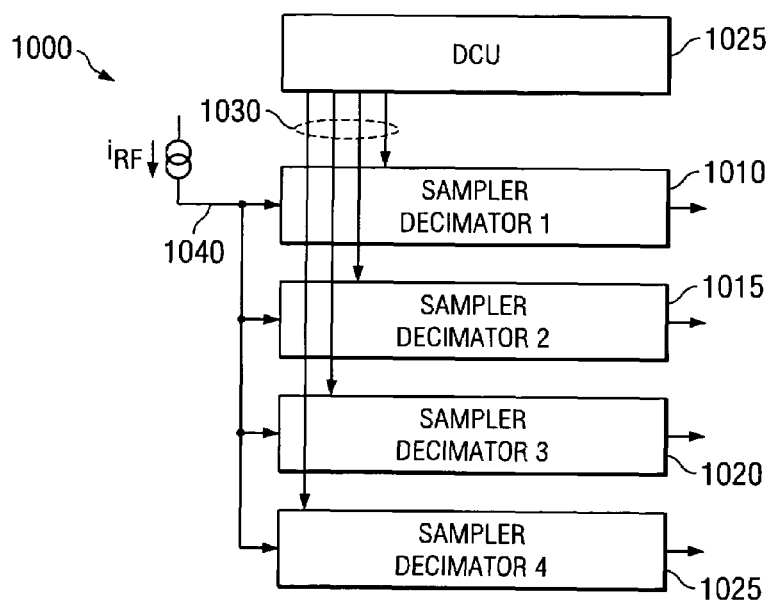
FIG. 10 illustrates a block diagram of a current-mode sampling mixer with four programmable sampling and decimating circuits according to a preferred embodiment of the present invention.

Referring now to FIG. 10, a block diagram illustrates a portion of a sampling mixer 1000 with four RF current accumulating circuits 1010, 1015, 1020, and 1025 according to a preferred embodiment of the present invention. The four RF current accumulating circuits support a quadrature mode mixer with I+, I–, Q+, and Q– signal streams. With minor modifications, the RF current accumulating circuits 1010, 1015, 1020, and 1025 can become four sampling and decimating circuits. The mixer's four sampling and decimating circuits are controlled by a digital control unit (DCU) 1025. The DCU 1025 is coupled to each of the four sampling and decimating circuits individually via independent connections, displayed as a group of connections 1030. Since it is possible for each of the four sampling and decimating circuits to be set to a different decimating ratio, it is preferred that each circuit be controlled by a different bubble shift register in the DCU 1025. Although a connection between the DCU 1025 and each of the single sampling and decimating circuit is displayed as a single line, it is actually composed of a plurality of connections. Each of the four sampling and decimating circuits receives the RF current through a common connection 1040 and each sampling and decimating circuit produces an output sample stream.

Figure 11:
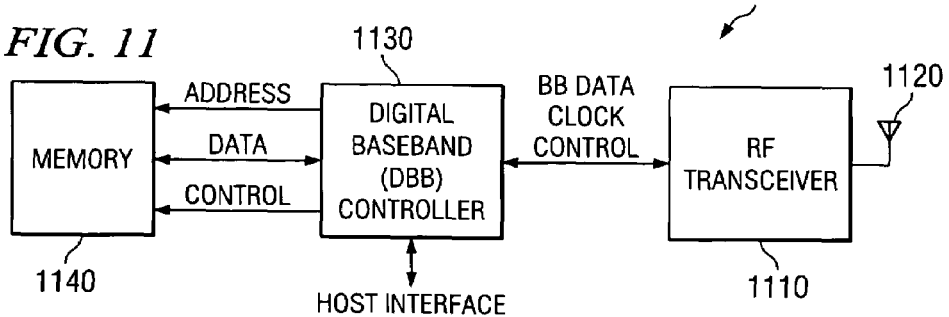
FIG. 11 illustrates a block diagram of a wireless communications device containing a direct sampling mixer according to a preferred embodiment of the present invention.

Referring now to FIG. 11, a block diagram illustrates a wireless communications device 1100 containing a direct sampling mixer according to a preferred embodiment of the present invention. As discussed previously, the direct sampling mixer of the present invention is operable at any radio frequency and with any data encoding and transmission mechanism. In actuality, the direct sampling mixer is also operable in a wired communications system as well.

The direct sampling mixer of the present invention is contained in an RF transceiver 1110 that is coupled to an antenna 1120. The antenna 1120 is responsible for receiving analog RF signals transmitted over-the-air. Additionally, the antenna 1120 may be used to transmit analog RF signals originating from the wireless device 1100. The RF transceiver 1110 is responsible for taking the analog RF signals received by the antenna 1120 and converting it into a digital data stream that is usable by the remainder of the wireless device 1100. Since the RF transceiver 1110 can transmit signals as well as receive them, the RF transceiver 1110 is also responsible for converting a digital data stream into an analog signal suitable for transmission.

After the RF transceiver 1110 receives and then converts the analog RF signal into a digital data stream by an analog-to-digital converter (ADC) or a quantizer (neither shown), the digital data stream is transferred to a digital baseband (DBB) controller 1130. The DBB controller 1130 is responsible for taking the digital data stream and perform any necessary digital signal processing on it to convert the digital data stream in to a stream of user usable data. Examples of the processing performed by the DBB controller 1130 may include, but is not limited to: digital filtering, data encoding and decoding, error detection and correction, and communications protocol software stack and applications. The DBB controller 1130 is coupled to a memory 1140 that may contain a read-only memory (ROM), a random access memory (RAM), flash programmable memory, etc. The memory 1140 can be used to store-necessary subroutines used in the DBB controllers 1130, configuration data, scratch memory, etc.

The DBB controller 1130 may be coupled to some other digital device via a host interface. The host interface may be a proprietary interface or it may be adherent to an interconnection standard such as: RS-232, universal serial bus, Firewire, IEEE 802.11, PCcard, etc. The host interface allows the connection of a digital device to the wireless device 1100 via the DBB controller 1130. Examples of digital devices include computers, multi-media devices, Internet appliances, storage devices, etc.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A programmable sample stream decimating circuit comprising:
   a programmable clock generator to generate a clock at a specified frequency;
   a digital control unit (DCU) coupled to the programmable clock generator, the DCU comprising a programmable timing generator to generate clock signals; and
   a plurality of sampling capacitors coupled to the digital control unit, each sampling capacitor is coupled to a radio frequency (RF) source and passes an RF signal produced by a RF source when it is activated by a clock signal from the DCU.

2. The programmable sample stream decimating circuit of claim 1, wherein the RF source is a RF current source and the plurality of sampling capacitors integrate the RF current produced by the RF current source.

3. The programmable sample stream decimating circuit of claim 1, wherein the RF source is a RF voltage source and the plurality of sampling capacitors sample the RF voltage produced by the RF voltage source.

4. The programmable sample stream decimating circuit of claim 1, wherein the programmable timing generator is a bubble shift register, the bubble shift register comprises:
   a sequence of at least two registers, wherein each register has a memory to store a value, and an output of a first register coupled to an input of a second register; and a multiplexer having an input for each register in the sequence, an output coupled to a first register in the sequence, and a select line input, each input of the multiplexer coupled to an output of each register in the sequence, the select line input to selectively select one input of the multiplexer and present a value on the selected input to the output of the multiplexer.

5. The programmable sample stream decimating circuit of claim 4, wherein there are at least two sequences of at least two registers, and the output of a multiplexer in a first sequence is coupled to an input of a first register in a second sequence and the output of a multiplexer in a second sequence is coupled to an input of a first register in a first sequence.

6. The programmable sample stream decimating circuit of claim 5, wherein the select line input is the same for each of the sequences.

7. The programmable sample stream decimating circuit of claim 1, wherein the programmable timing generator is a bubble shift register, the bubble shift register comprises:
a sequence of at least two registers, wherein each register has a memory to store a value, wherein each register is coupled to a programmable clock, and an output of a first register coupled to an input of a second register, and an output of a final register is coupled to an input of the first register.

8. The programmable sample stream decimating circuit of claim 7, wherein the programmable clock of each register can be set to produce a clock signal with a specified period.

9. The programmable sample stream decimating circuit of claim 8, wherein each programmable clock can be set to produce a clock signal with a different period.

10. The programmable sample stream decimating circuit of claim 7, wherein the sequence further comprising:
a multiplexer with an input for each register in the sequence, an output coupled to the first register in the sequence, and a select line input, each input of the multiplexer coupled to an output of each register in the sequence, the select line input to selectively select one input of the multiplexer and present a value on the selected input to the output of the multiplexer.

11. The programmable sample stream decimating circuit of claim 10, wherein there are at least two sequences of at least two registers, and the output of a multiplexer in a first sequence is coupled to an input of a first register in a second sequence and the output of a multiplexer in a second sequence is coupled to an input of a first register in a first sequence.

12. A method, comprising the steps of:
generating a clock at a specified frequency using a programmable clock generator;
generating clock signals using a programmable timing generator in a digital control unit (DCU), the digital control unit (DCU) coupled to the programmable clock generator; and
passing an RF signal produced by an RF source through one of a plurality of sampling capacitors coupled to the digital control unit (DCU) when activated by a clock signal from the digital control unit (DCU).

13. The method of claim 12, wherein the RE source is a RF current source and the plurality of sampling capacitors integrate the RF current produced by the RF current source.

14. The method of claim 12, wherein the RF source is a RF voltage source and the plurality of sampling capacitors sample the RF voltage produced by the RF voltage source.

15. The method of claim 12, wherein the programmable timing generator is a bubble shift register, the bubble shift register comprises:
a sequence of at least two registers, wherein each register has a memory to store a value, and an output of a first register coupled to an input of a second register; and
a multiplexer having an input for each register in the sequence, an output coupled to a first register in the sequence, and a select line input, each input of the multiplexer coupled to an output of each register in the sequence, the select line input to selectively select one input of the multiplexer and present a value on the selected input to the output of the multiplexer.

16. The method of claim 15, wherein there are at least two sequences of at least two registers, and the output of a multiplexer in a first sequence is coupled to an input of a first register in a second sequence and the output of a multiplexer in a second sequence is coupled to an input of a first register in a first sequence.

17. The method of claim 12, wherein the programmable timing generator is a bubble shift register, the bubble shift register comprises:
a sequence of at least two registers, wherein each register has a memory to store a value, wherein each register is coupled to a programmable clock, and an output of a first register coupled to an input of a second register, and an output of a final register is coupled to an input of the first register.

18. The method of claim 17, wherein the programmable clock of each register can be set to produce a clock signal with a specified period.

19. The method of claim 17, wherein the sequence further comprising:
a multiplexer with an input for each register in the sequence, an output coupled to the first register in the sequence, and a select line input, each input of the multiplexer coupled to an output of each register in the sequence, the select line input to selectively select one input of the multiplexer and present a value on the selected input to the output of the multiplexer.

20. The method of claim 19, wherein there are at least two sequences of at least two registers, and the output of a multiplexer in a first sequence is coupled to an input of a first register in a second sequence and the output of a multiplexer in a second sequence is coupled to an input of a first register in a first sequence.

* * * * *